(12) United States Patent
Tsukagoshi et al.

(10) Patent No.: US 10,794,760 B2
(45) Date of Patent: Oct. 6, 2020

(54) OPTICAL SENSOR DEVICE

(71) Applicants: ABLIC Inc., Chiba-shi, Chiba (JP);
Tohoku Techno Arch Co., Ltd.,
Sendai-shi, Miyagi (JP)

(72) Inventors: Koji Tsukagoshi, Chiba (JP);
Shigetoshi Sugawa, Sendai (JP); Rihito Kuroda, Sendai (JP)

(73) Assignees: ABLIC INC., Chiba (JP); TOHOKU TECHNO ARCH CO., LTD., Miyagi (JP)

( * ) Notice: Subject to any disclaimer, the term of this patent is extended or adjusted under 35 U.S.C. 154(b) by 438 days.

(21) Appl. No.: 15/895,477

(22) Filed: Feb. 13, 2018

(65) Prior Publication Data
US 2018/0231414 A1 Aug. 16, 2018

(30) Foreign Application Priority Data
Feb. 15, 2017 (JP) .................. 2017-026245

(51) Int. Cl.
*G01J 1/42* (2006.01)
*H05K 1/03* (2006.01)
*H05K 1/02* (2006.01)
*G01J 1/04* (2006.01)
(Continued)

(52) U.S. Cl.
CPC .............. *G01J 1/429* (2013.01); *G01J 1/0209* (2013.01); *G01J 1/0403* (2013.01); *G01J 1/0488* (2013.01); *G01J 1/4228* (2013.01); *H01L 31/02162* (2013.01); *H05K 1/0274* (2013.01); *H05K 1/0306* (2013.01);
(Continued)

(58) Field of Classification Search
CPC ........ G01J 1/429; G01J 1/4228; G01J 1/0488; G01J 1/0209; G01J 3/36; G01J 3/51; H01L 2924/181; H01L 2924/00
USPC ........................................................ 250/372
See application file for complete search history.

(56) References Cited

U.S. PATENT DOCUMENTS 9,958,386 B2 * 5/2018 Moriya .............. G01N 21/6454
2006/0049533 A1 * 3/2006 Kamoshita .............. H01L 24/97
264/1.7

(Continued)

FOREIGN PATENT DOCUMENTS

| JP | H01-207640 A | 8/1989 |
| JP | 2009-177150 A | 8/2009 |
| JP | 2009-200222 A | 9/2009 |

*Primary Examiner* — Yara B Green
(74) *Attorney, Agent, or Firm* — Brinks Gilson & Lione

(57) ABSTRACT

This optical sensor device includes a first light receiving portion having sensitivity to ultraviolet light, a first sealing portion covering the first light receiving portion, a second light receiving portion having sensitivity to ultraviolet light, and a second sealing portion which covers the second light receiving portion. At least one of the first sealing portion and the second sealing portion is configured to transmit at least part of a ultraviolet light wavelength band, the first sealing portion is formed from one or more resin layers and has transmission spectral characteristics that a first wavelength is set as a lower limit value of a transmission wavelength band, and the second sealing portion is formed from one or more resin layers and has transmission spectral characteristics that a second wavelength different from the first wavelength is set as a lower limit value of the transmission wavelength band.

19 Claims, 9 Drawing Sheets

(51) Int. Cl.
*G01J 1/02* (2006.01)
*H01L 31/0216* (2014.01)

(52) U.S. Cl.
CPC ......... *H05K 1/0366* (2013.01); *H05K 1/0373* (2013.01); *H05K 2201/10151* (2013.01)

(56) References Cited

U.S. PATENT DOCUMENTS

| | | | |
|---|---|---|---|
| 2008/0035835 A1* | 2/2008 | Komatsu | B82Y 10/00 250/208.1 |
| 2009/0184388 A1* | 7/2009 | Izumi | H01L 31/02162 257/463 |
| 2013/0050068 A1* | 2/2013 | Inoue | G01J 1/4204 345/102 |
| 2016/0284875 A1* | 9/2016 | Tsukagoshi | H01L 31/186 |
| 2017/0236861 A1* | 8/2017 | Ockenfuss | G01J 3/36 257/432 |

* cited by examiner

OPTICAL SENSOR DEVICE

RELATED APPLICATIONS

This application claims priority under 35 U.S.C. § 119 to Japanese Patent Application No. 2017-026245 filed on Feb. 15, 2017, the entire content of which is hereby incorporated by reference.

BACKGROUND OF THE INVENTION

1. Field of the Invention

The present invention relates to an optical sensor device.

2. Description of the Related Art

Ultraviolet light may cause a bad influence on the human body such as the skin or eyes, but cannot be recognized by the naked eye. Japanese Unexamined Patent Application, First Publication No. H1-207640 discloses a semiconductor optical detection device which includes a semiconductor optical detection element having a first light receiving portion and a second light receiving portion as an ultraviolet sensor using a semiconductor, and a signal processing circuit which obtains an ultraviolet light detection output from a difference between an output of the first light receiving portion and an output of the second light receiving portion.

Japanese Unexamined Patent Application, First Publication No. 2009-177150 discloses an optical detection device with a configuration in which light enters two light-receiving elements with different spectral characteristics so that the electric charges are accumulated in the light-receiving elements and a voltage difference in accordance with a difference in accumulated electric charges is output.

Japanese Unexamined Patent Application, First Publication No. 2009-200222 discloses an ultraviolet sensor in which a package that houses a sensor chip therein and seals the sensor chip from an external atmosphere, includes a cylindrical casing formed from a metal and a window member formed from sapphire or quartz.

In the optical detection device described in Japanese Unexamined Patent Application, First Publication No. H1-207640, the first light receiving portion has sensitivity to ultraviolet light due to a shallow impurity doping depth of the first light receiving portion, the second light receiving portion does not have sensitivity to ultraviolet light due to a deep impurity doping depth of the second light receiving portion, and a light transmitting film of silicon dioxide is formed on surfaces of a first light receiving portion and a second light receiving portion.

According to a first embodiment of the optical detection device described in Japanese Unexamined Patent Application, First Publication No. 2009-177150, a shield or a filter is formed from a semiconductor thin film such as polysilicon, and two light-receiving elements having different spectral characteristics are used in the same manner in Japanese Unexamined Patent Application, First Publication No. H1-207640. According to a second embodiment of Japanese Unexamined Patent Application, First Publication No. 2009-177150, a difference in the spectral characteristics of two light-receiving elements is provided by configuring polysilicon with different film thicknesses on the light-receiving elements.

According to these conventional technologies, a semiconductor process becomes complicated, the cost increases and the productivity decreases.

In the ultraviolet sensor described in Japanese Unexamined Patent Application, First Publication No. 2009-200222, since the metal casing has a light shielding property with respect to the ultraviolet light, it is only possible to detect light passing through the window member disposed immediately above the sensor chip and enters the sensor chip. Since the sapphire and the quartz are expensive and have high brittleness, the processing is difficult and the manufacture at a low cost is difficult to be realized.

The present invention has been made in view of the above circumstances, and an object thereof is to provide an optical sensor device which can be realized with high productivity and at a low cost.

SUMMARY OF THE INVENTION

The present invention adopts the following aspects to achieve the object.

(1) That is, an optical sensor device according to one aspect of the present invention includes a first light receiving portion having sensitivity to ultraviolet light, a first sealing portion covering the first light receiving portion, a second light receiving portion having sensitivity to ultraviolet light, and a second sealing portion which covers the second light receiving portion, in which at least one of the first sealing portion and the second sealing portion being configured to transmit at least part of an ultraviolet light wavelength band, the first sealing portion being formed from one layer or more than one resin layers, and the first sealing portion having a transmission spectral characteristic in which a first wavelength is set as a lower limit value of a transmission wavelength band, the second sealing portion being formed from one resin layer or more than one resin layers, and the second sealing portion having a transmission spectral characteristic in which a second wavelength different from the first wavelength is set as a lower limit value of a transmission wavelength band.

(2) In the optical sensor device according to (1) described above, the following configuration may be adopted: both the first sealing portion and the second sealing portion are integratedly included in a resin sealing portion, and the resin sealing portion is formed from a plurality of transparent resins adjacent to each other.

(3) In the optical sensor device according to (1) or (2) described above, the following configuration may be adopted: the first sealing portion and the second sealing portion are formed using two types of resins selected from a first transparent resin which shows permeability from 250 nm and has a transmission spectral characteristic in which a transmittance in a wavelength band longer than 300 nm is equal to or more than 90%, a second transparent resin which shows permeability from 315 nm and has a transmission spectral characteristic in which a transmittance in a wavelength band longer than 350 nm is equal to or more than 90%, and a third transparent resin which shows permeability from 380 nm and has a transmission spectral characteristic in which a transmittance in a wavelength band longer than 400 nm is equal to or more than 90%.

(4) In the optical sensor device according to (1) or (2) described above, the following configuration may be adopted: the first sealing portion and the second sealing portion are formed using two types of resins selected from a first epoxy resin which shows permeability from 250 nm, has a transmission spectral characteristic in which a transmittance in a wavelength band longer than 300 nm is equal to or more than 90%, and is made from triglycidyl isocyanurate, a second epoxy resin which shows permeability from 315 nm, has a transmission spectral characteristic in which a transmittance in a wavelength band longer than 350 nm is equal to or more than 90%, and is formed from a mixture of triglycidyl isocyanurate and bisphenol A diglycidyl ether with the triglycidyl isocyanurate as a main component, and a third epoxy resin which shows permeability from 380 nm, has a transmission spectral characteristic in which a transmittance in a wavelength band longer than 400 nm is equal to or more than 90%, and is formed from a mixture of bisphenol A diglycidyl ether and triglycidyl isocyanurate with the bisphenol A diglycidyl ether as a main component.

(5) In the optical sensor device according to (1) or (2) described above, the following configuration may be adopted: the first sealing portion and the second sealing portion are formed using two types of resins selected from a first transparent resin which shows permeability from 250 nm, has a transmission spectral characteristic with a rising portion having a transmittance equal to or more than 80% at 280 nm and a transmittance equal to or more than 90% at 300 nm, and with a transmittance equal to or more than 95% on a wavelength side longer than the rising portion, a second transparent resin which shows permeability from 315 nm, has a transmission spectral characteristic with a rising portion having a transmittance equal to or more than 80% at 320 nm and a transmittance equal to or more than 90% at 350 nm, and with a transmittance equal to or more than 95% on a wavelength side longer than the rising portion, and a third transparent resin which shows permeability from 380 nm, has a transmission spectral characteristic with a rising portion having a transmittance equal to or more than 80% at 390 nm and a transmittance equal to or more than 90% at 400 nm, and with a transmittance equal to or more than 95% on a wavelength side longer than the rising portion.

According to each aspect of the present invention described above, since a resin sealing portion gives different transmission spectral characteristics to the two light receiving portions, it is possible to provide an optical sensor device which can be realized with high productivity and at a low cost.

DETAILED DESCRIPTION OF THE PREFERRED EMBODIMENTS

Hereinafter, embodiments of an optical sensor device of the present invention will be described in detail with reference to appropriate drawings. Drawings used in the following description may be schematically shown to make features easier to understand, and dimension ratios and the like of each component are not necessarily the same as actual data.

First Embodiment

Figure 1:
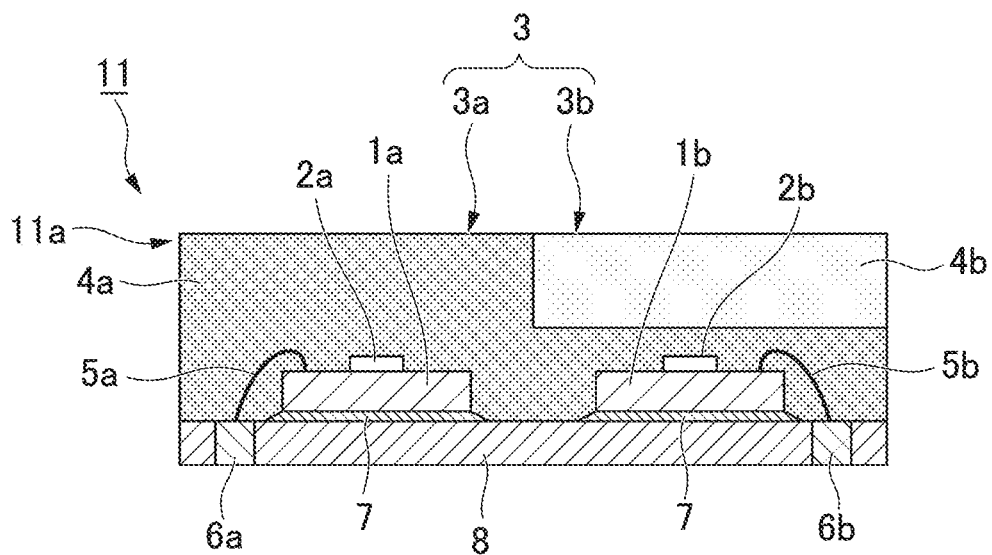
FIG. 1 is a longitudinal sectional view which schematically shows a configuration of an optical sensor device according to a first embodiment of the present invention.
Figure 2:
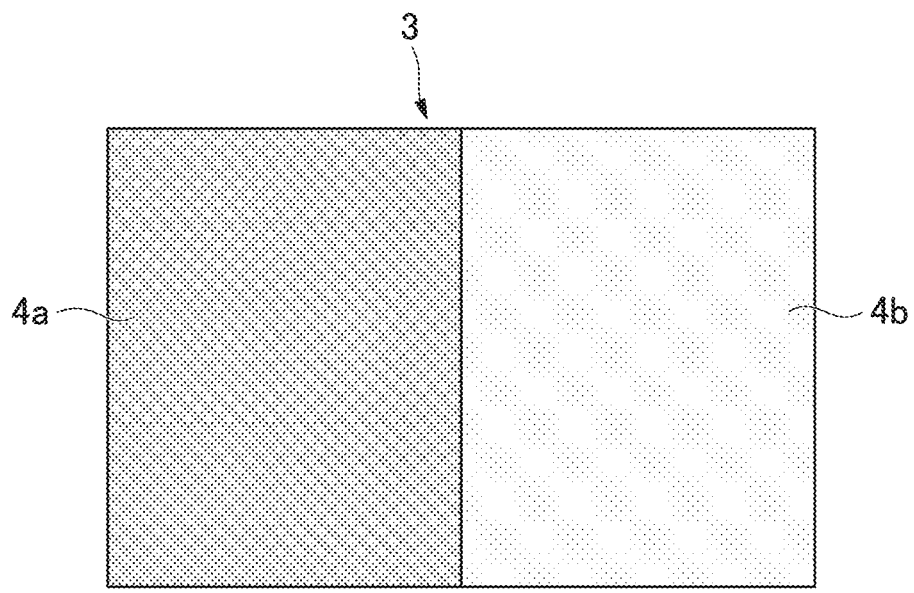
FIG. 2 is a top view which schematically shows the configuration of the optical sensor device according to the first embodiment.

FIGS. 1 and 2 schematically show a configuration of an optical sensor device 11 according to a first embodiment. FIG. 1 is a longitudinal sectional view along a plane including two light receiving portions 2a and 2b. FIG. 2 is a top view which shows a surface on a side of a resin sealing portion 3.

An optical sensor device 11 according to the present embodiment includes a package structure 11a in which two sensor chips 1a and 1b are sealed by the resin sealing portion 3. The package structure 11a includes a first sensor chip 1a including a first light receiving portion 2a, a second sensor chip 1b including a second light receiving portion 2b, an element mounting portion 8 on which the sensor chips 1a and 1b are mounted, and the resin sealing portion 3 which seals surfaces of the sensor chips 1a and 1b and the element mounting portion 8.

The light receiving portions 2a and 2b are optical sensor elements which have sensitivity to ultraviolet light and output signals in accordance with an amount of the incident light. As the light receiving portions 2a and 2b, for example, semiconductor elements such as photodiodes are used. The outputs of the light receiving portions 2a and 2b may be amplified by an amplifier circuit.

Each of the light receiving portions 2a and 2b may have sensitivity to at least part of an ultraviolet light wavelength band. The light receiving portions 2a and 2b may have sensitivity to at least part of a visible light wavelength band. The light receiving portions 2a and 2b may have sensitivity to the whole visible light wavelength band. The light receiving portions 2a and 2b may have sensitivity to at least part of an infrared light wavelength band. Two light receiving portions 2a and 2b may have sensitivity to the same wavelength bands as each other.

It is preferable that two of the light receiving portions 2a and 2b have the same light receiving characteristics with respect to the ultraviolet light and the visible light. As a result, it is possible to share a production process of the light receiving portions 2a and 2b for increasing productivity. As the light receiving characteristics, for example, output characteristics with respect to a wavelength and intensity of incident light to the light receiving portions 2a and 2b are used. The light receiving characteristics mean the characteristics of the incident light to the light receiving portions 2a and 2b themselves without considering an influence of the sealing portions 3a and 3b with respect to the incident light.

It is preferable that a range of a wavelength band in which light receiving characteristics of the light receiving portions 2a and 2b are the same as each other includes at least part of the ultraviolet light wavelength band and at least part of the visible light wavelength band, and may further include at least part of the infrared light wavelength band. The wavelength band in which the light receiving characteristics of the light receiving portions 2a and 2b are considered is, for example, in a range from at least part of a near ultraviolet light wavelength band to at least part of a near infrared light wavelength band, and a range of 200 nm to 900 nm can be used as a specific example.

The resin sealing portion 3 according to the present embodiment is integratedly formed, and the resin sealing portion 3 includes both the first sealing portion 3a and the second sealing portion 3b. According to the resin sealing portion 3, the sealing portions 3a and 3b protect the light receiving portions 2a and 2b by covering the light receiving portions 2a and 2b, respectively. In the resin sealing portion 3, the first sealing portion 3a covers the first light receiving portion 2a. The second sealing portion 3b further covers the second light receiving portion 2b which is covered by the first sealing portion 3a.

The resin sealing portion 3 can be configured by a plurality of transparent resins adjacent to each other. The resin sealing portion 3 according to the present embodiment includes a first sealing resin 4a adhered to the two light receiving portions 2a and 2b, and a second sealing resin 4b disposed by overlapping the first sealing resin 4a. The first sealing resin 4a and the second sealing resin 4b are adjacent to each other such that excellent adhesion can be ensured. By providing the resin sealing portion 3 on the light receiving portions 2a and 2b, reliability such as heat resistance, impact resistance, and moisture resistance can be ensured.

The first sealing resin 4a seals at least the periphery of each of the sensor chips 1a and 1b.

A space between the respective sensor chips 1a and 1b may be filled with the first sealing resin 4a. The first sealing resin 4a whose thickness partially changes can be formed by, for example, a transfer molding method. Each of the light receiving portions 2a and 2b is covered with one type of sealing resin 4a such that it is possible to suppress damage of the light receiving portions 2a and 2b during a resin sealing process.

Thicknesses of the first sealing resin 4a covering each of the light receiving portions 2a and 2b may be different. In the example shown in FIG. 1, the thickness of the first sealing resin 4a on the light receiving portion 2a is thicker than the thickness of the first sealing resin 4a on the light receiving portion 2b. In this case, the sealing portion 3a may be configured by one layer of a resin layer formed from the first sealing resin 4a.

Unlike the example shown in FIG. 1, the thickness of the first sealing resin 4a on the light receiving portion 2b may be thicker than the thickness of the first sealing resin 4a on the light receiving portion 2a. In this case, the sealing portion 3b may be configured by one layer of a resin layer formed from the first sealing resin 4a.

The second sealing resin 4b is laminated on either of the two light receiving portions 2a and 2b on which the thickness of the first sealing resin 4a is thinner. The second sealing resin 4b can be formed by, for example, the transfer molding method, a potting method, and the like.

In the example shown in FIG. 1, the sealing portion 3b on the light receiving portion 2b is configured from a two-layer lamination structure of the first sealing resin 4a and the second sealing resin 4b. Unlike the example shown in FIG. 1, the sealing portion 3a on the light receiving portion 2a may be configured from the two-layer lamination structure of the first sealing resin 4a and the second sealing resin 4b.

A thickness of the first sealing portion 3a and a thickness of the second sealing portion 3b may be the same as each other. For example, in the example shown in FIG. 1, a total thickness of the first sealing resin 4a and the second sealing resin 4b on the second light receiving portion 2b is the same degree with respect to the thickness of the first sealing resin 4a on the first light receiving portion 2a. The thicknesses of each of the respective sealing portions 3a and 3b may be adjusted in accordance with transmission spectral characteristics of each of the respective sealing portions 3a and 3b.

On the second light receiving portion 2b and in the periphery thereof, an interface between the first sealing portion 3a and the second sealing portion 3b may be substantially parallel to a light receiving surface of the second light receiving portion 2b. Alternatively, on the second light receiving portion 2b and in the periphery thereof, the interface between the first sealing portion 3a and the second sealing portion 3b may be substantially parallel to a top surface of the sensor chip 1b including the second light receiving portion 2b. As a result, the second sealing resin 4b is formed on a substantially parallel plane, and thus formation of the second sealing resin 4b becomes easy.

It is preferable that the interface between the first sealing resin 4a and the second sealing resin 4b is not only disposed in a substantially parallel manner above the second light receiving portion 2b but also disposed in a substantially perpendicular manner at an intermediate portion between both light receiving portions 2a and 2b. As a result, an area of the interface between the first sealing resin 4a and the second sealing resin 4b is enlarged and the adhesion is improved. The first sealing resin 4a has an L-shaped cross section so that the first sealing resin 4a is thick on the first light receiving portion 2a side and is thin on the second light receiving portion 2b side, and thus, even if the second sealing resin 4b has fluidity, the second sealing resin 4b is prevented from leaking sideways from above the first sealing resin 4a when the second sealing resin 4b is formed by potting or the like.

When the incident light to the optical sensor device 11 enters each of the light receiving portions 2a and 2b through each of the sealing portions 3a and 3b, respectively, transmission spectral characteristics of the respective sealing portions 3a and 3b at least in the ultraviolet light wavelength band are different from each other. For example, a lower limit value of a transmission wavelength band of the first sealing portion 3a is set as a first wavelength $\lambda_1$, a lower limit value of a transmission wavelength band of the second sealing portion 3b is set as a second wavelength $\lambda_2$, and $\lambda_1$ and $\lambda_2$ which are lower limit values of the transmission wavelength band of each of the sealing portions 3a and 3b may be different from each other, respectively.

Here, if $\lambda_1 > \lambda_2$, the incident light in a wavelength band which is longer than $\lambda 2$ and shorter than $\lambda_1$ passes through only the second sealing portion 3b, and is received only by the second light receiving portion 2b. Conversely, if $\lambda_2 > \lambda_1$, the incident light in a wavelength band which is longer than $\lambda_1$ and shorter than $\lambda_2$ passes through only the first sealing portion 3a, and is received only by the first light receiving portion 2a. That is, the incident light in a wavelength band between $\lambda_1$ and $\lambda_2$ passes through only one of the sealing portions 3a and 3b and does not substantially pass through the other one. Only one of $\lambda_1$ and $\lambda_2$ is necessary to be included in the ultraviolet light wavelength band, and the other one of $\lambda_1$ and $\lambda_2$ may be included in the visible light wavelength band. As the lower limit value of the transmission wavelength band, for example, a wavelength whose transmittance of light is near a lower detection limit is considered.

Since the transmission spectral characteristics of the sealing portions 3a and 3b described above are different from each other, the optical sensor device 11 has different spectral characteristics for two light receiving portions 2a and 2b. Here, the spectral characteristics refer to a corresponding relationship between the wavelength of incident light to the optical sensor device 11 and the outputs of each of the light receiving portions 2a and 2b, and the spectral characteristics may be called spectral sensitivity, spectral sensitivity characteristics, and the like. That is, there is a dependence relationship between the outputs of the light receiving portions 2a and 2b and the wavelength of incident light to the optical sensor device 11. The spectral characteristics of the light receiving portions 2a and 2b are affected by not only the light receiving characteristics of the light receiving portions 2a and 2b but also the transmission spectral characteristics of the sealing portions 3a and 3b. For example, even if either of the light receiving portions 2a and 2b has sensitivity to a specific wavelength, when the light of the specific wavelength is substantially prevented from being received by the sealing portions 3a and 3b disposed on the light receiving portions 2a and 2b, respectively, the light receiving portions 2a and 2b have no spectral sensitivity to the specific wavelength.

A difference in the spectral characteristics of the light receiving portions 2a and 2b may be given only by a difference in the transmission spectral characteristics of the sealing portions 3a and 3b, and may be given by both the difference in the transmission spectral characteristics of the sealing portions 3a and 3b and a difference in the light receiving characteristics of the light receiving portions 2a and 2b.

By identifying a difference between a first output which is output from the first light receiving portion 2a and a second output which is output from the second light receiving portion 2b, it is possible to obtain an intensity of light in a wavelength band which has passed through only one of the sealing portions 3a and 3b between $\lambda_1$ and $\lambda_2$. That is, it is possible to obtain an intensity of ultraviolet incident light to the optical sensor device 11. There is no particular limitation on a method of identifying the difference, and for example, a method of identifying the difference in an optical current occurring at each of the light receiving portions 2a and 2b may adopted. Alternatively, as disclosed in Japanese Unexamined Patent Application, First Publication No. 2009-177150, a method of identifying the difference in voltage may be adopted.

According to the first embodiment, the sealing portions 3a and 3b covering each of the light receiving portions 2a and 2b are made from resins with different transmission spectral characteristics, such that the spectral characteristics of the respective light receiving portions 2a and 2b can be changed at a stage of resin-sealing a semiconductor. As a result, it is possible to configure an optical sensor device which can directly receive and detect ultraviolet light without using complicated structures, expensive components, materials, and the like. The optical sensor device of the first embodiment can be made small and thin, and can be manufactured with high productivity and at a low cost.

As disclosed in the "Second embodiment" of Japanese Unexamined Patent Application, First Publication No. 2009-177150, when a filter layer is formed from polysilicon to have a different transmittance in accordance with a wavelength of light, the formation needs to be performed in a semiconductor manufacturing process requiring a high temperature such as 400° C. However, since poly silicon, unlike a silicone resin, is rigid and brittle, it is not as flexible as a sealing resin. It is difficult to deposit a polysilicon layer thickly even using a CVD method. Furthermore, since impurities diffuse into polysilicon, the poly silicon has almost no property of protecting the inside of an optical sensor device from external contamination like a sealing resin.

According to the present embodiment, since the spectral characteristics of the light receiving portions 2a and 2b are adjusted by the sealing portions 3a and 3b made from resins, it is possible to form the sealing portions 3a and 3b at a lower temperature, and it is possible to suppress damage to the light receiving portions 2a and 2b due to heating.

According to the present embodiment, when the second sealing resin 4b is laminated on a portion of the first sealing resin 4a, it is preferable that a lower limit value $\lambda b$ of the transmission wavelength band of the second sealing resin 4b is longer than a lower limit value $\lambda a$ of the transmission wavelength band of the first sealing resin 4a. In this case, a lower limit value of the transmission wavelength band of the sealing portion 3b obtained by laminating the second sealing resin 4b on the first sealing resin 4a is the same as the lower limit value $\lambda b$ of the transmission wavelength band of the second sealing resin 4b. Further, a lower limit value of the transmission wavelength band of the sealing portion 3a made from only the first sealing resin 4a is the same as the lower limit value $\lambda a$ of the transmission wavelength band of the first sealing resin 4a. By identifying a difference in the outputs of each of the light receiving portions 2a and 2b, the incident light in a wavelength band longer than $\lambda a$ and shorter than $\lambda b$ is detected by the optical sensor device 11. At this time, the second sealing resin 4b functions as an optical filter which prevents the incident light in a wavelength band to be detected from entering the second light receiving portion 2b.

The sensor chips 1a and 1b are fixed to a surface of the element mounting portion 8 by a die attach agent 7. Electrodes (not shown) disposed in the sensor chips 1a and 1b and through electrodes 6a and 6b disposed in the element mounting portion 8 are electrically connected via wires 5a and 5b. The surfaces of the element mounting portion 8 and the wires 5a and 5b may be sealed by the resin sealing portion 3. Furthermore, in the present embodiment, the periphery of the respective light receiving portions 2a and 2b and sensor chips 1a and 1b including the wires 5a and 5b is sealed by the first sealing resin 4a.

The respective light receiving portions 2a and 2b and the wires 5a and 5b are covered by one type of sealing resin 4a, such that it is possible to easily manufacture a mold for forming the second sealing resin 4b. When the first sealing resin is formed, since the light receiving portions 2a and 2b and the wires 5a and 5b are covered in a single process, only the same stress as the formation of a normal resin-seal type package is applied.

The through electrodes 6a and 6b penetrate from the front surface to the rear surface of the element mounting portion 8. The rear surface side of the element mounting portion 8 is not covered with the resin sealing portion 3, and is exposed to the outside. The through electrodes 6a and 6b exposed to the rear surface side of the element mounting portion 8 function as external terminals.

The element mounting portion 8 can be configured by an insulating resin, a fiber laminated plate impregnated with a resin, a ceramic, glass, silicon, and the like. As the fiber laminated plate, for example, a glass fiber laminated plate is considered. A resin forming the element mounting portion 8 may contain carbon, silica, and the like to absorb light at the surface of the element mounting portion 8 and to have low reflectance. For the same purpose, in the resin forming the element mounting portion 8, the resin impregnated in the fiber laminated plate may contain carbon, silica, and the like. A metal wiring, which is not specifically shown, can be disposed on the surface of the element mounting portion 8. In this case, low reflectance plating may be applied to a surface of the metal wiring. The low reflectance plating is only necessary to be a plating process that decreases reflectivity to be lower than a surface of a metal wiring which is not plated. As described above, the surfaces of the element mounting portion 8 have a light absorbing property and low reflectivity, and such that it is possible to suppress light reflection inside the resin sealing portion 3.

Second Embodiment

Figure 3:
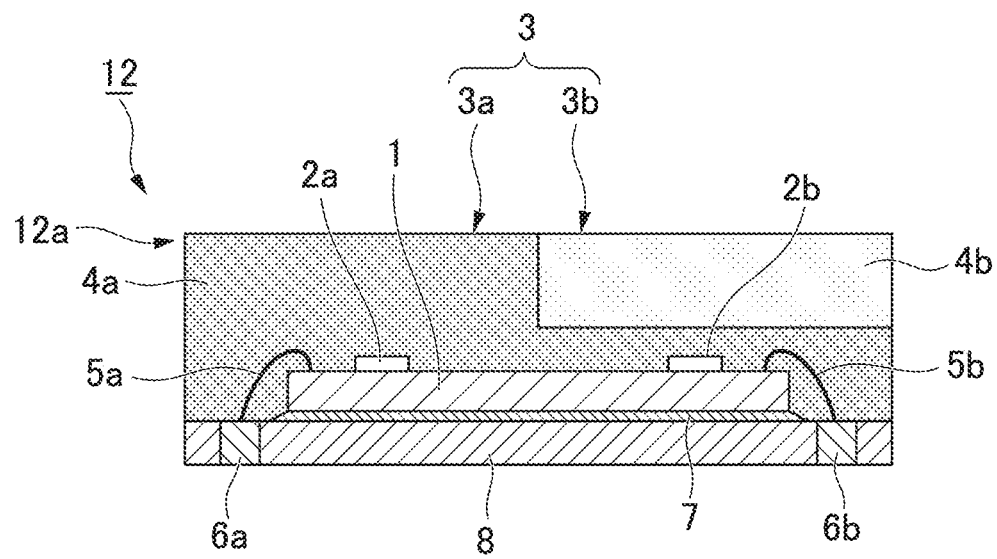
FIG. 3 is a longitudinal sectional view which schematically shows a configuration of an optical sensor device according to a second embodiment of the present invention.

FIG. 3 schematically shows a configuration of an optical sensor device 12 according to a second embodiment of the present invention. FIG. 3 is a longitudinal sectional view of a cross section including two light receiving portions 2a and 2b. A surface on the resin sealing portion 3 side may be formed in the same manner as in FIG. 2 of the first embodiment described above. In the description of the present embodiment, the same reference numerals are given to constituent elements which are common to the first embodiment and descriptions thereof may be omitted.

The optical sensor device 12 according to the present embodiment includes a package structure 12a in which a sensor chip 1 having two light receiving portions 2a and 2b is sealed by a resin sealing portion 3. This package structure 12a includes the sensor chip 1 having a first light receiving portion 2a and a second light receiving portion 2b, an element mounting portion 8 on which the sensor chip 1 is mounted, and a resin sealing portion 3 which seals surfaces of the sensor chip 1 and the element mounting portion 8.

The resin sealing portion 3 according to the present embodiment includes the first sealing resin 4a adhered to two light receiving portions 2a and 2b and the second sealing resin 4b disposed to overlap the first sealing resin 4a, which is the same as in the first embodiment. The present embodiment is different from the first embodiment in that one sensor chip 1 has a plurality of light receiving portions 2a and 2b. That is, each of the light receiving portions 2a and 2b is included in a separate sensor chip 1a or 1b according to the first embodiment, but each of the light receiving portions 2a and 2b is included in one sensor chip 1 according to the present embodiment.

According to the present embodiment, since one sensor chip 1 is mounted on the element mounting portion 8, it is possible to reduce a mounting area occupied by the sensor chip 1 as compared with the first embodiment in which two sensor chips 1a and 1b are mounted on the element mounting portion 8. According to the present embodiment, it is advantageous for a space-saving design, and the package structure 12a can be decreased in size.

According to the present embodiment, as the same manner according to the first embodiment, each of the light receiving portions 2a and 2b and the wires 5a and 5b are covered with one type of sealing resin 4a, such that it is possible to suppress damage to the light receiving portions 2a and 2b and the wires 5a and 5b during a resin sealing process.

(Top Surface Structure of Resin Sealing Portion)

Figure 4:
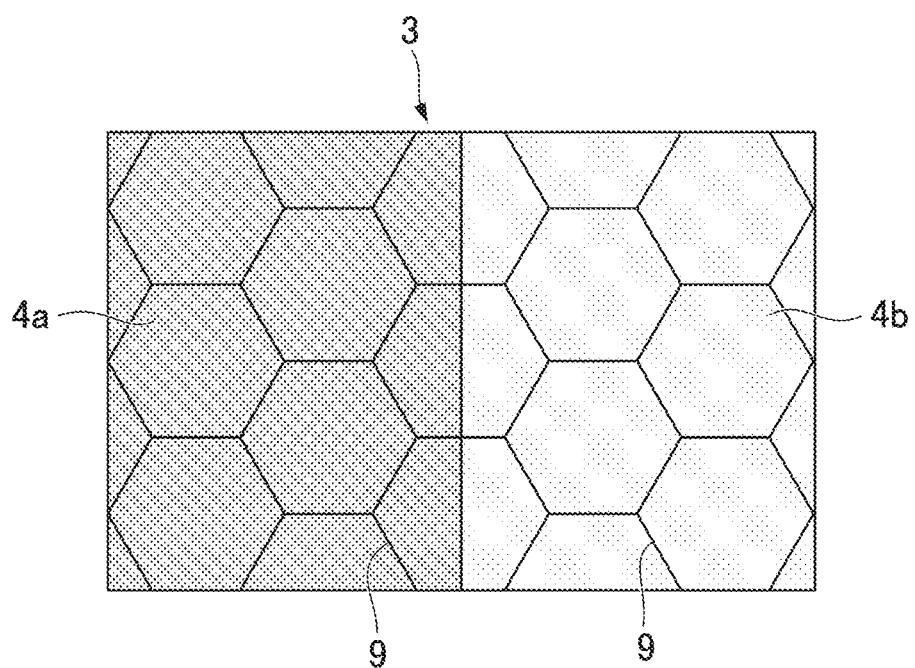
FIG. 4 is a top view which schematically shows a configuration in which a surface structure portion is disposed in the optical sensor device according to the first embodiment or the second embodiment.

FIG. 4 shows an example in which a surface structure portion 9 obtained by combining and disposing, for example, a plurality of hexagons is provided on the top surface of the resin sealing portion 3 in the first embodiment or the second embodiment. In an actual use environment of an optical sensor device which detects ultraviolet light passing through the resin sealing portion 3 using the light receiving portions 2a and 2b, it is also possible to provide a cover member (not shown) transmitting ultraviolet light on an outer side of the resin sealing portion 3. The cover member may be formed from, for example, glass, a resin, or the like. Alternatively, it is possible to expose the resin sealing portion 3 to the outside.

As described above, the light receiving portions 2a and 2b, the sensor chips 1a and 1b (1), surface wiring (wires 5a and 5b), and the like which are internal structures of the optical sensor element are covered with the resin sealing portion 3. When a resin material forming the resin sealing portion 3 has high transmittance with respect to visible light, it is possible to make the internal structures sealed by the resin sealing portion 3 visually recognizable to a user. On the other hand, there are cases in which it is desired that the internal structures of the resin sealing portion 3 are nearly invisible for a user to visually recognize. In this case, by providing the surface structure portion 9 on the top surface of the resin sealing portion 3, even when the resin sealing portion 3 is exposed to a user, the internal structures can be made difficult to be visually recognized without lowering the transmittance of the resin sealing portion 3. Furthermore, it is possible to give decorativeness and a design property to the top surface of the resin sealing portion 3 using the surface structure portion 9.

The surface structure portion 9 may include surface undulations such as recessed grooves, projections, and the like. A shape of the surface structure portion 9 is not particularly limited, but may be a shape in which one or more types of polygons or the like are repeatedly arranged or may also be a shape including an irregular pattern. A method of forming the surface structure portion 9 is not particularly limited, and a shape including the surface structure portion 9 may be formed when the resin sealing portion 3 is formed. After the resin sealing portion 3 whose top surface is flat is formed, the surface structure portion 9 can be formed by an embossing process or the like.

FIG. 4 shows an example in which the arrangement of two types of sealing resins 4a and 4b is the same as in FIG. 2, but even when the arrangement of the sealing resins 4a and 4b is different from in FIG. 2, the surface structure portion 9 can be adopted. The line width, the interval, the number of lines, and the like of the surface structure portion 9 can be appropriately changed.

Third Embodiment

Figure 5:
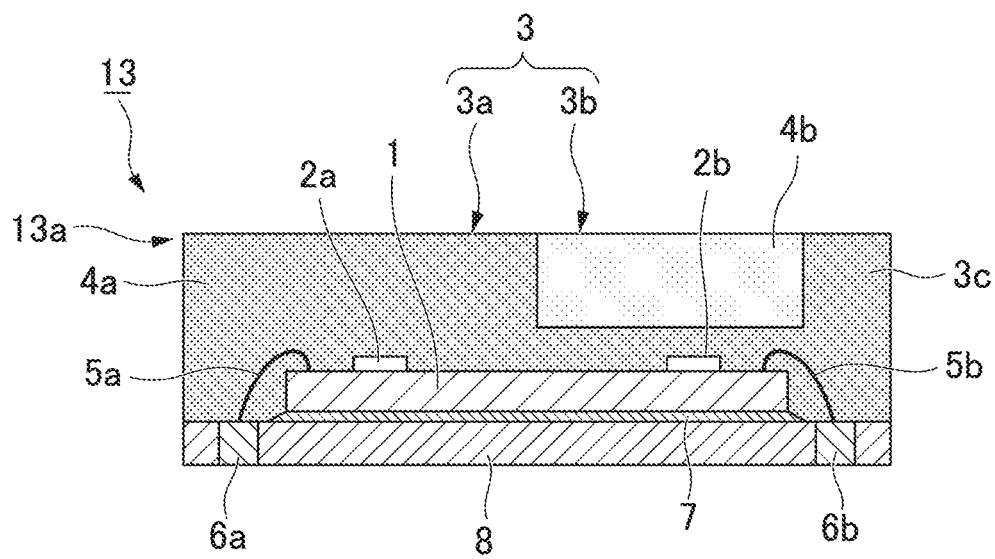
FIG. 5 is a longitudinal sectional view which schematically shows a configuration of an optical sensor device according to a third embodiment of the present invention.
Figure 6:
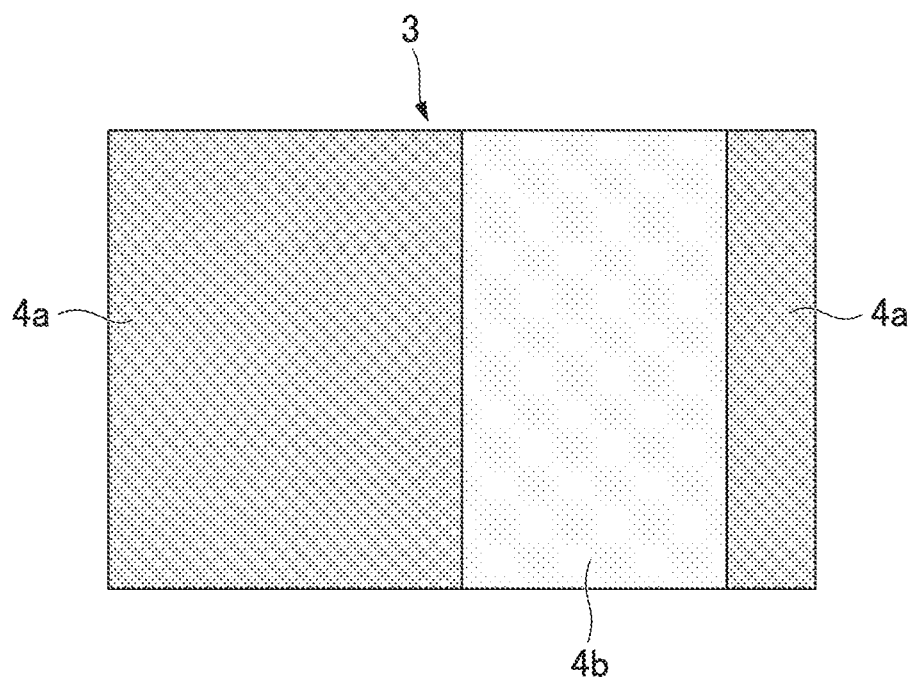
FIG. 6 is a top view which schematically shows the configuration of the optical sensor device according to the third embodiment.

FIGS. 5 and 6 schematically show a configuration of an optical sensor device 13 according to a third embodiment of the present invention. FIG. 5 is a longitudinal sectional view when a cross section including two light receiving portions 2a and 2b is viewed. FIG. 6 is a top view which shows surfaces on the side of the resin sealing portion 3. According to the present embodiment, the same reference numerals are given to constituent elements which are common to the first embodiment or the second embodiment described above, and descriptions thereof may be omitted.

The resin sealing portion 3 according to the present embodiment has a first sealing resin 4a adhered to two light receiving portions 2a and 2b, and a second sealing resin 4b disposed to overlap the first sealing resin 4a on one side of the light receiving portion 2b, which is the same as in the first embodiment or the second embodiment. The present embodiment is different from the first embodiment or the second embodiment in that the second sealing resin 4b is not laminated on a side surface portion 3c of the resin sealing portion 3 and a thickness of the first sealing resin 4a is partially the same degree as that of the sealing portion 3a.

An area in which the second sealing resin 4b is disposed in the resin sealing portion 3 includes at least a region through which incident light to the second light receiving portion 2b passes. Accordingly, even if the second sealing resin 4b is not disposed at the side surface portion 3c, the same function as in the first embodiment or the second embodiment can be provided.

The area in which the second sealing resin 4b is disposed may be far narrower than shown in FIGS. 5 and 6, and may also be, for example, only half on the light receiving portion 2b side above the sensor chip 1.

Since an interface between the two types of sealing resins 4a and 4b is not exposed at the side surface portion 3c according to the present embodiment, strength of the resin sealing portion 3 against impact from a side surface can be improved. Since the second sealing resin 4b is interposed between the first sealing resin 4a of the sealing portion 3a and the first sealing resin 4a of the side surface portion 3c and an area of the interface between the sealing resins 4a and 4b is enlarged, it is possible to increase adhesion between the sealing resins 4a and 4b.

In FIG. 5, a package structure 13a in which the sensor chip 1 including two light receiving portions 2a and 2b is sealed by the resin sealing portion 3 in the same manner as in the second embodiment is shown. However, the present embodiment may have a package structure in which two sensor chips 1a and 1b are sealed by the resin sealing portion 3 in the same manner as the first embodiment.

Fourth Embodiment

Figure 7:
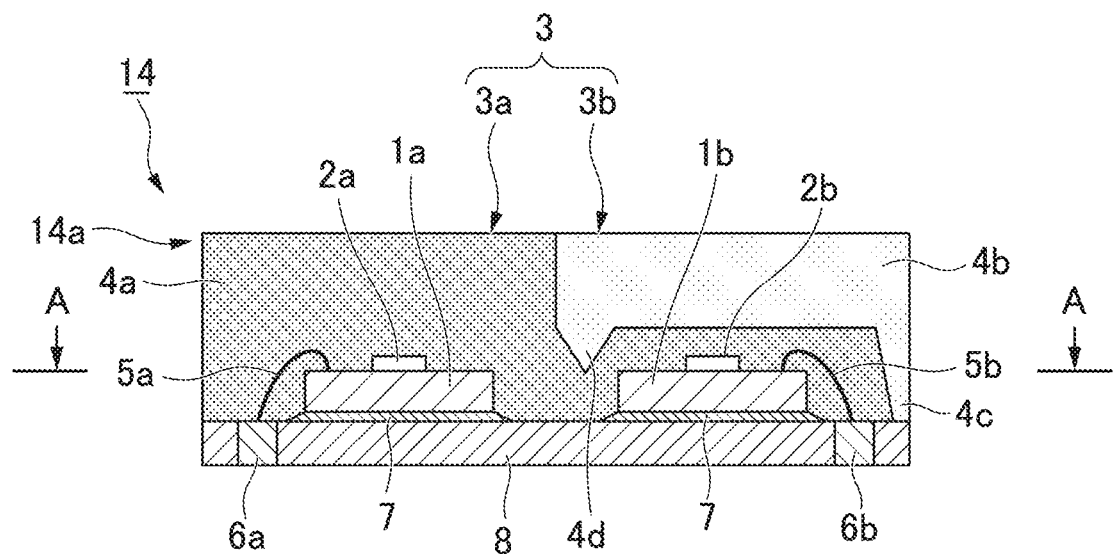
FIG. 7 is a longitudinal sectional view which schematically shows a configuration of an optical sensor device according to a fourth embodiment of the present invention.
Figure 8:
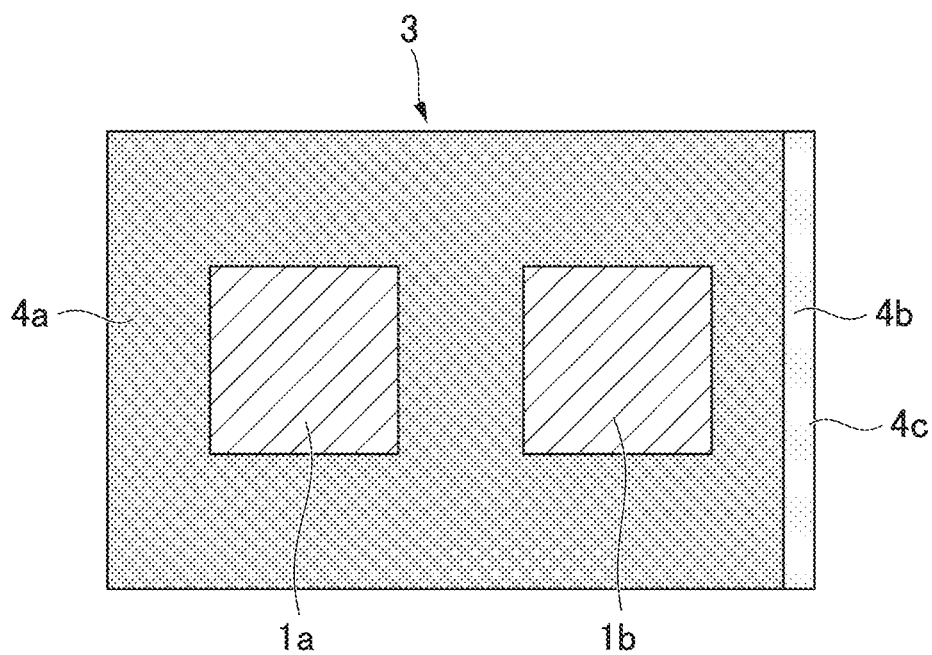
FIG. 8 is a plan sectional view which schematically shows a configuration in a horizontal direction along a sensor chip in the optical sensor device according to the fourth embodiment.
Figure 9:
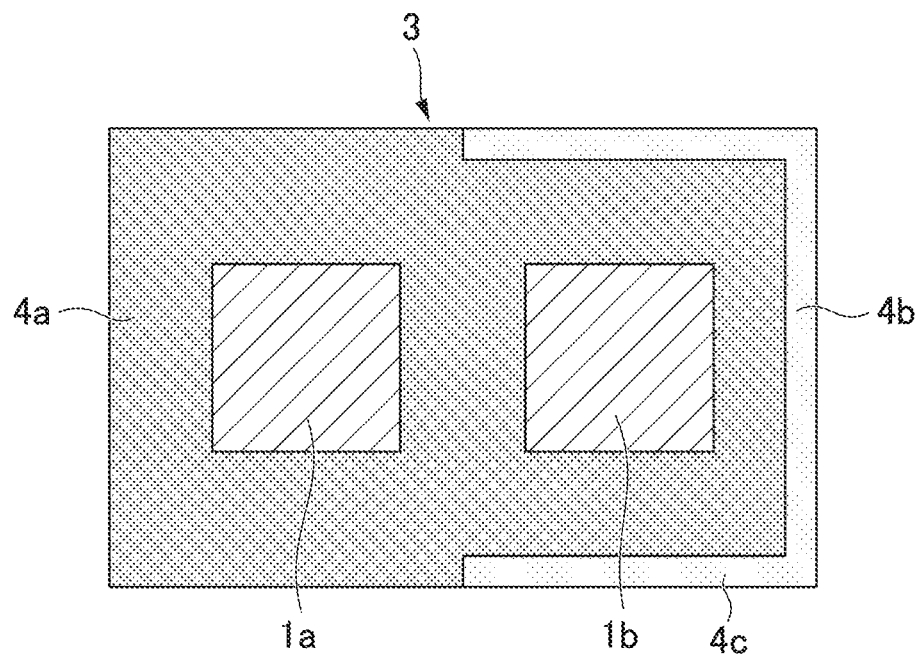
FIG. 9 is a plan sectional view which schematically shows the configuration in the horizontal direction along a sensor chip in the optical sensor device according to the fourth embodiment.

FIGS. 7 to 9 schematically show a configuration of an optical sensor device 14 according to a fourth embodiment of the present invention. FIG. 7 is a longitudinal sectional view along a plane including two light receiving portions 2a and 2b. FIGS. 8 and 9 are sectional views in a horizontal direction along sensor chips 1a and 1b (sectional views taken along line A-A of FIG. 7). In the present embodiment, the same reference numerals are given to constituent elements which are common to the first embodiment described above, and descriptions thereof may be omitted.

The resin sealing portion 3 according to the present embodiment has the first sealing resin 4a adhered to two light receiving portions 2a and 2b and the second sealing resin 4b disposed by overlapping the first sealing resin 4a on one of the light receiving portion 2b, as the same as in the first embodiment or the second embodiment. In a package structure 14a according to the present embodiment, a plurality of sensor chips 1a and 1b is sealed by the resin sealing portion 3, as the same as in the first embodiment.

The resin sealing portion 3 according to the present embodiment is different from that in the first embodiment in that the resin sealing portion 3 has protruding structures 4c and 4d protruding downward so that an interface between the first sealing resin 4a and the second sealing resin 4b is angled and a thickness of the second sealing resin 4b increases. That is, the second sealing resin 4b extends downward in the protruding structures 4c and 4d. The direction of the angle of the interface between the sealing resins 4a and 4b may be a direction in which the thickness of the second sealing resin 4b increases as it is spaced farther from any one of the light receiving portions 2a and 2b. Here, "being spaced from the light receiving portions 2a and 2b" may mean that, for example, a horizontal distance along the surface of the element mounting portion 8 increases. "The thickness of the second sealing resin 4b increases" may mean that a vertical distance from the top surface of the element mounting portion 8 to the interface between the first sealing resin 4a and the second sealing resin 4b decreases. Here, the vertical distance is a distance in a vertical direction perpendicular to the surface of the element mounting portion 8.

A top surface of the second sealing resin 4b may be substantially horizontal as a whole, and may also be substantially parallel to, for example, the top surface of the element mounting portion 8. At this time, the thickness of the second sealing resin 4b in the protruding structures 4c and 4d is larger than the thickness of the second sealing resin 4b above the light receiving portion 2b.

The protruding structure 4c is disposed on a side different from the side of the first sensor chip 1a in a periphery of the second sensor chip 1b. In the example shown in FIG. 8, the protruding structure 4c is disposed on one side opposite to the side of the first sensor chip 1a in the periphery of the second sensor chip 1b. In the example shown in FIG. 9, the protruding structure 4c is disposed on three sides different from the side of the first sensor chip 1a in the periphery of the second sensor chip 1b.

The protruding structure 4c has a structure angled such that the thickness of the second sealing resin 4b increases as being spaced farther from the second light receiving portion 2b. Alternatively, the protruding structure 4c may have a structure angled such that the interface between the sealing resins 4a and 4b approaches the element mounting portion 8 regardless of a shape of the top surface of the second sealing resin 4b. Among incident light to the resin sealing portion 3, the light not directly received by the receiving portions 2a and 2b becomes stray light, and the stray light is repeatedly reflected in the first sealing resin 4a in some cases. Since the interface between the sealing resins 4a and 4b exists above the second light receiving portion 2b, for example, if the stray light heads for the second light receiving portion 2b via the reflection at the interface between the sealing resins 4a and 4b, it is possible that an error in the output of the second light receiving portion 2b may increase.

Then, the protruding structure 4c functions as a critical angle with respect to the stray light or the protruding structure 4c reflects the stray light towards the element mounting portion 8 with low reflection, such that the entry of the stray light to the second light receiving portion 2b can be suppressed. In this case, as in the example shown in FIG. 9, it is possible to further suppress the entry of the stray light to the second light receiving portion 2b by enlarging a range in which the protruding structure 4c is formed.

In a place in which the protruding structure 4c is disposed, an area in which an outer peripheral side surface of the first sealing resin 4a is exposed to the outside of the resin sealing portion 3 can be made narrower or eliminated in the periphery of the second light receiving portion 2b. As a result, it is possible to suppress the entry of light to the second light receiving portion 2b, the light incident from an outer peripheral side surface of the resin sealing portion 3, and the light passing through only the first sealing resin 4a. Accordingly, when a difference is calculated between an output generated by light which has passed through only the first sealing resin 4a and entered the first light receiving portion 2a and an output generated by light which has passed through the second sealing resin 4b and entered the second light receiving portion 2b, it is possible to suppress an error due to an output generated by light which has passed through only the first sealing resin 4a and entered the second light receiving portion 2b.

The protruding structure 4d is disposed in a region between the plurality of light receiving portions 2a and 2b. An interface on a side closer to the second light receiving portion 2b in the protruding structure 4d has a structure angled such that the thickness of the second sealing resin 4b increases as being spaced farther from the second light receiving portion 2b. Accordingly, when the stray light heads for a side of the first light receiving portion 2a from a side of the second light receiving portion 2b, a direction of the stray light can be changed due to reflection against the protruding structure 4d and the like, and thus it is possible to suppress the stray light from entering the first light receiving portion 2a by interface reflection and the like.

An interface on a side closer to the first light receiving portion 2a in the protruding structure 4d may have a structure angled such that the thickness of the second sealing resin 4b increases as being spaced farther from the first light receiving portion 2a. Accordingly, when the stray light heads for the side of the second light receiving portion 2b from the side of the first light receiving portion 2a, the direction of the stray light can be changed due to reflection against the protruding structure 4d and the like, and thus it is possible to suppress the stray light from entering the second light receiving portion 2b by interface reflection and the like.

The distance between lower ends of the protruding structures 4c and 4d and the element mounting portion 8 may be closer than a distance between light-receiving surfaces of the light receiving portions 2a and 2b and the element mounting portion 8. Furthermore, at least a portion of the lower ends of the protruding structures 4c and 4d may be in contact with the element mounting portion 8.

In at least a portion of the protruding structures 4c and 4d, the second sealing resin 4b is in contact with the element mounting portion 8, such that it is possible to improve adhesion intensity and mechanical intensity of the second sealing resin 4b. In this case, as in the example shown in FIG. 9, if a range in which the protruding structure 4c is formed in the periphery of the light receiving portion 2b is large, an contact area between the second sealing resin 4b and the element mounting portion 8 increases, and thus the adhesion intensity and the mechanical intensity of the second sealing resin 4b can be further improved.

Fifth Embodiment

Figure 10:
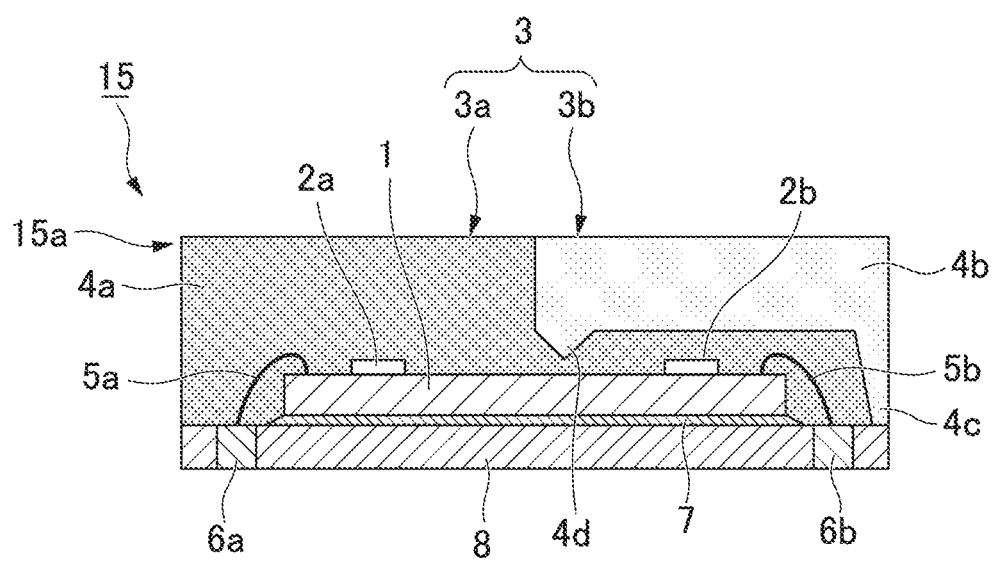
FIG. 10 is a longitudinal sectional view which schematically shows a configuration of an optical sensor device according to a fifth embodiment of the present invention.

FIG. 10 schematically shows a configuration of an optical sensor device 15 according to a fifth embodiment of the present invention. FIG. 10 is a longitudinal sectional view along a cross section including two light receiving portions 2a and 2b. In the present embodiment, the same reference numerals are given to constituent elements which are common to the first embodiment, the second embodiment, or the fourth embodiment and descriptions thereof may be omitted.

The resin sealing portion 3 according to the present embodiment has the protruding structures 4c and 4d on an interface between sealing resins 4a and 4b, as the same in the fourth embodiment. The protruding structure 4c disposed on a side surface on an outer peripheral side of a second sealing resin 4b has the same effect as in the fourth embodiment.

A package structure 15a according to the present embodiment is different from in the fourth embodiment in that the package structure 15a has a plurality of light receiving portions 2a and 2b in one sensor chip 1 in the same manner as the second embodiment. According to the present embodiment, a protruding structure 4d disposed in a region between the plurality of light receiving portions 2a and 2b is disposed above the sensor chip 1.

When the sensor chip 1 having the plurality of light receiving portions 2a and 2b is used, it is possible that the stray light is repeatedly reflected between the surface of the sensor chip 1 and the interface between the sealing resins 4a and 4b, and the stray light heads from one side of the plurality of light receiving portions 2a and 2b to the other side. According to the present embodiment, the protruding structure 4d is disposed in the resin sealing portion 3, such that it is possible to suppress incident light to the first light receiving portion 2a side from entering the second light receiving portion 2b, or suppress incident light to the second light receiving portion 2b side from entering the first light receiving portion 2a, as the same effect as in the fourth embodiment. The lower end of the protruding structure 4d may be in contact with the top surface of the sensor chip 1.

In the resin sealing portion 3 having the protruding structure 4c according to the fourth embodiment or the fifth embodiment, it is possible to combine the side surface portion 3c which has an increased thickness of the first sealing resin 4a without laminating the second sealing resin 4b on the side surface portion 3c in the same manner as in the third embodiment. For example, the protruding structure 4c may be disposed on a side different from the side surface portion 3c among three sides of the periphery of the light receiving portion 2b.

Sixth Embodiment

Figure 11:
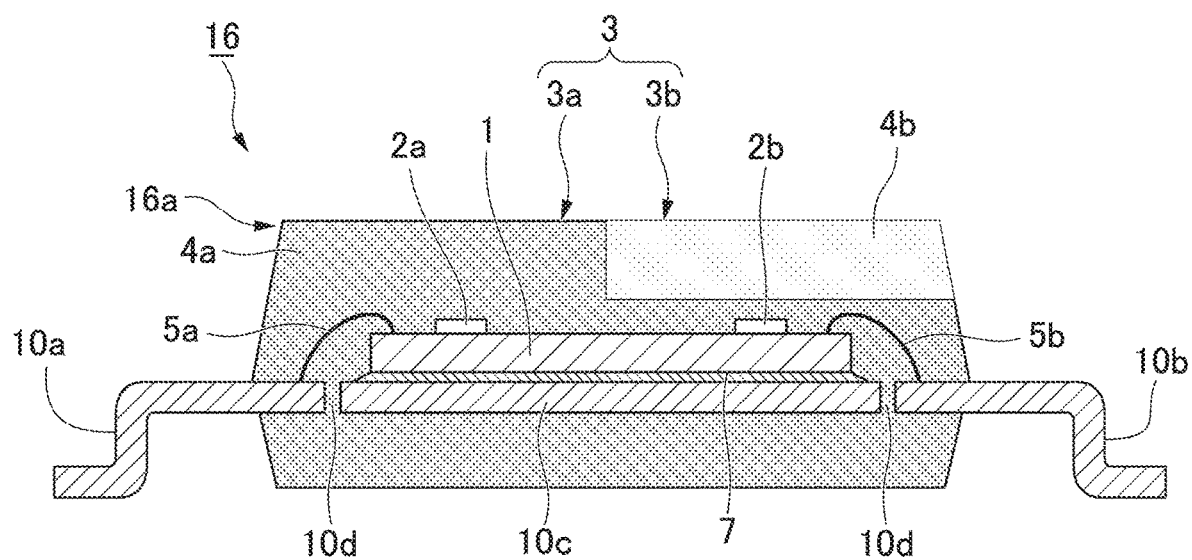
FIG. 11 is a longitudinal sectional view which schematically shows a configuration of an optical sensor device according to a sixth embodiment of the present invention.

FIG. 11 schematically shows a configuration of an optical sensor device 16 according to a sixth embodiment of the present invention. FIG. 11 is a longitudinal sectional view along a cross section including two light receiving portions 2a and 2b. In the description of the present embodiment, the same reference numerals are given to constituent elements which are common to the first embodiment or the second embodiment, and descriptions thereof may be omitted.

A package structure 16a shown in FIG. 11 is different from in the second embodiment in that the package structure 16a has leads 10a and 10b adjacent to the element mounting portion 10c, instead of the element mounting portion 8 including the through electrodes 6a and 6b shown in FIG. 3 of the second embodiment. The leads 10a and 10b and the element mounting portion 10c according to the present embodiment can be formed from a metal such as copper, iron, or aluminum. The present embodiment is the same as the first embodiment or the second embodiment in that the sensor chip 1 is fixed to the element mounting portion 10c by the die attach agent 7.

The wires 5a and 5b disposed to correspond to the light receiving portions 2a and 2b, respectively, are connected to different leads 10a and 10b. An output from the first light receiving portion 2a is connected to the lead 10a, and an output from the second light receiving portion 2b is connected to the lead 10b. There may be a gap 10d insulated by a resin of the resin sealing portion 3 between the leads 10a and 10b and the element mounting portion 10c. During a manufacturing process, the leads 10a and 10b and the element mounting portion 10c may be connected by an outer frame, a tape, or the like before completion of the resin sealing portion 3. The leads 10a and 10b may be configured using a lead frame.

One ends of the leads 10a and 10b are connected to the sensor chip 1 using the wires 5a and 5b, respectively, and are sealed by the resin sealing portion 3. According to the present embodiment, one ends of the leads 10a and 10b like the wires 5a, 5b, and the like are covered with the first sealing resin 4a. The other ends of the leads 10a and 10b are exposed to the outside of the resin sealing portion 3 and become external terminals.

Surfaces of the leads 10a and 10b and a surface of the element mounting portion 10c may be metalized. Low reflectance plating is preferable for these metalizations. As the low reflectance plating, silver plating and the like in which glossiness is lowered and reflectance of light is reduced is considered. The surfaces of the leads 10a and 10b and the surface of the element mounting portion 10c have low reflectivity, such that it is possible to suppress light reflection inside the resin sealing portion 3. As a result, it is possible to reduce an error caused by the stray light being incident on the light receiving portions 2a and 2b.

In FIG. 11, the package structure 13a in which the sensor chip 1 including two light receiving portions 2a and 2b is sealed by the resin sealing portion 3 in the same manner as in the second embodiment is shown. However, a package structure in which two sensor chips 1a and 1b are sealed by the resin sealing portion 3 in the same manner as in the first embodiment may also be disposed in the present embodiment. The leads 10a and 10b according to the present embodiment can be combined with a side surface portion 3c of a first sealing resin 4a as in the third embodiment. The leads 10a and 10b according to the present embodiment can be combined with the protruding structures 4c and 4d of the fourth embodiment or the fifth embodiment.

Seventh Embodiment

Figure 12:
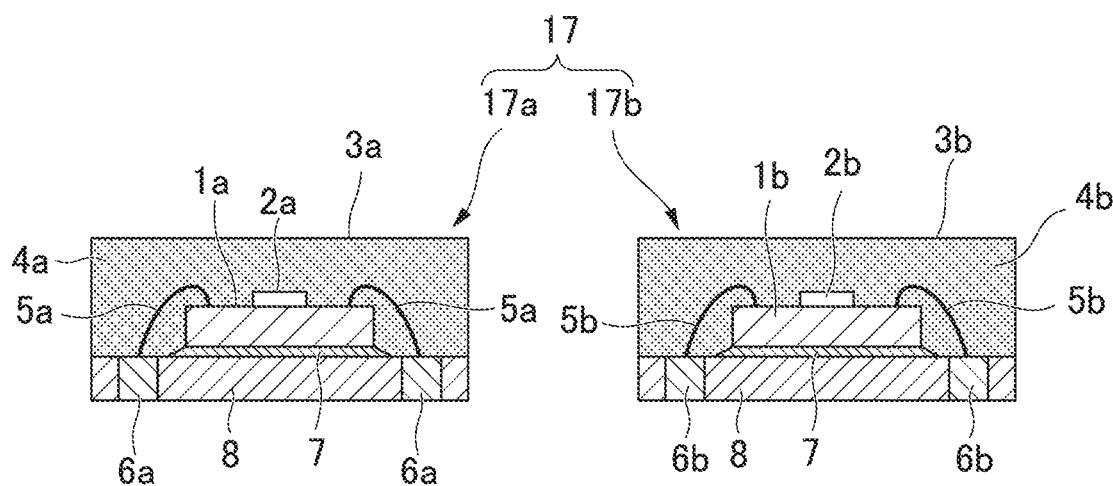
FIG. 12 is a longitudinal sectional view which schematically shows a configuration of an optical sensor device according to a seventh embodiment of the present invention.

FIG. 12 schematically shows a configuration of an optical sensor device 17 according to a seventh embodiment of the present invention. FIG. 12 is a longitudinal sectional view along a cross section including two light receiving portions 2a and 2b. In the description of the present embodiment, the same reference numerals are given to constituent elements which are common to the first embodiment, and descriptions thereof may be omitted.

In the optical sensor device 17 according to the present embodiment, a sensor chip 1a having the light receiving portion 2a and a sensor chip 1b having the light receiving portion 2b are sealed by different sealing portions 3a and 3b, respectively. That is, the optical sensor device 17 has a first package structure 17a in which the first sensor chip 1a sealed by the first sealing portion 3a and a second package structure 17b in which the second sensor chip 1b sealed by the second sealing portion 3b.

In the package structure 17a, the sensor chip 1a is fixed to an element mounting portion 8 by, for example, a die attach agent 7, and the like and is connected to a through electrode 6a by a wire 5a and the like in the same manner as in the first embodiment. In the package structure 17b, the sensor chip 1b is fixed to the element mounting portion 8 and is connected to a through electrode 6b by a wire 5b and the like in the same manner as in the first embodiment. The wires 5a and 5b are sealed by the sealing portions 3a and 3b, respectively. The through electrodes 6a and 6b exposed on a rear surface side function as external terminals. Each of the sealing portions 3a and 3b is a resin sealing portion made from one or more layers of resin.

In the case of the present embodiment, each of the sealing portions 3a and 3b may be configured by one type of sealing resin 4a or 4b. Specifically, the first sealing portion 3a can be configured by a first sealing resin 4a, and the second sealing portion 3b can be configured by a second sealing resin 4b. For this reason, for example, continuous mass production can be performed in a method of coating or dripping a liquid type of resin such as an epoxy resin onto surfaces of respective sensor chips 1a and 1b and the element mounting portion 8 and thermally curing the resin. In the case of potting, a paste or slurry type of resin is used. The sealing resins 4a and 4b may also be formed in a transfer molding method.

The first sealing portion 3a which seals the first light receiving portion 2a and the second sealing portion 3b which seals the second light receiving portion 2b have different transmission spectral characteristics. In the case of the seventh embodiment, since the sealing portions 3a and 3b are respectively configured from two types of sealing resins 4a and 4b which are different from each other, the transmission spectral characteristics of the first sealing resin 4a are different from the transmission spectral characteristics of the second sealing resin 4b.

For example, a lower limit value of the transmission wavelength band of the first sealing portion 3a is set as a first wavelength $\lambda_1$, and a lower limit value of the transmission wavelength band of the second sealing portion 3b is set as $\lambda_2$, if $\lambda_1 > \lambda_2$, a wavelength band between $\lambda_2$ and $\lambda_1$ passes through only the second sealing portion 3b and is received only by the second light receiving portion 2b. Conversely, if $\lambda_2 > \lambda_1$, a wavelength band between $\lambda_1$ and $\lambda_2$ passes through only the first sealing portion 3a and is received only by the first light receiving portion 2a.

By identifying a difference between a first output which is output from the first light receiving portion 2a and a second output which is output from the second light receiving portion 2b, it is possible to obtain a light intensity of wavelength band which is between $\lambda_1$ and $\lambda_2$ and has passed through only one of the sealing portions 3a and 3b. Accordingly, an intensity of ultraviolet incident light to the optical sensor device 17 can be obtained. A method of identifying the difference is not particularly limited, and, for example, a difference in optical current occurring at each of the light receiving portions 2a and 2b may be identified. Alternatively, as disclosed in Japanese Unexamined Patent Application, First Publication No. 2009-177150, a difference in current may also be identified.

According to the present embodiment, the sealing portions 3a and 3b which cover each of the light receiving portions 2a and 2b are configured by sealing resins with different transmission spectral characteristics, such that it is possible to change the spectral characteristics of each of the light receiving portions 2a and 2b at the stage of resin-sealing a semiconductor. Accordingly, it is possible to obtain an optical sensor device capable of directly receiving and detecting ultraviolet light without using a complicated structure, expensive parts, materials, or the like. The optical sensor device 17 according to the present embodiment can be made small and thin, and can be manufactured with high productivity and at a low cost.

The light receiving portion 2a and the wire 5a may be covered with one type of sealing resin 4a in the first package structure 17a, and the light receiving portion 2b and the wire 5b may be covered with one type of sealing resin 4b in the second package structure 17b. Each of the package structures 17a and 17b is sealed by each one type of the sealing resins 4a and 4b, such that it is possible to suppress damage to the light receiving portions 2a and 2b and the wires 5a and 5b during the resin sealing process.

Eighth Embodiment

Figure 13:
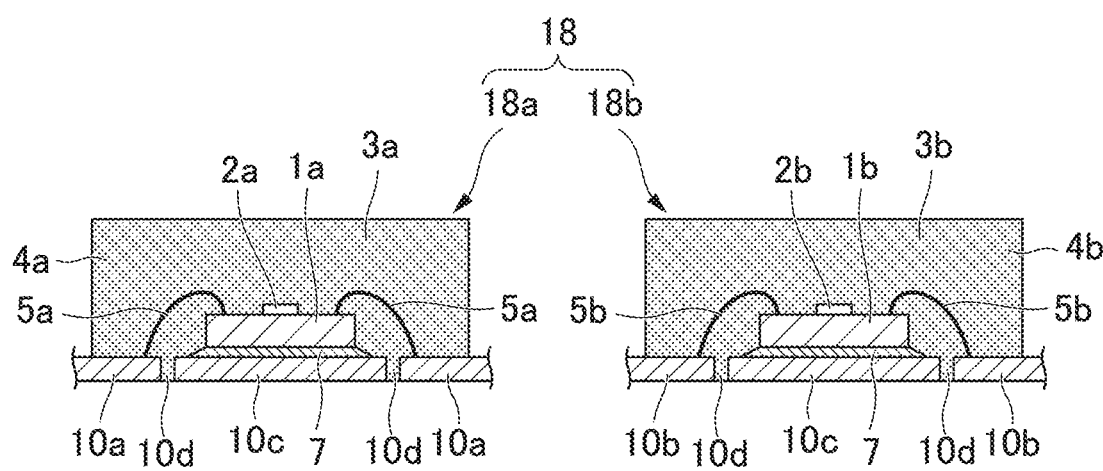
FIG. 13 is a longitudinal sectional view which schematically shows a configuration of an optical sensor device according to an eighth embodiment of the present invention.

FIG. 13 schematically shows a configuration of an optical sensor device 18 according to an eighth embodiment of the present invention. FIG. 13 is a longitudinal sectional view along a cross section including two light receiving portions 2a and 2b. In the description of the present embodiment, the same reference numerals are given to constituent elements which are common to the first embodiment or the seventh embodiment, and descriptions thereof may be omitted.

According to the present embodiment, the sensor chips 1a and 1b having the light receiving portions 2a and 2b, respectively, are sealed by different package structures 18a and 18b, as the same as the seventh embodiment.

The package structures 18a and 18b according to the present embodiment is different from in the seventh embodiment in that the package structures have leads 10a and 10b adjacent to an element mounting portion 10c as shown in FIG. 13 instead of the element mounting portion 8 including the through electrodes 6a and 6b shown in FIG. 12 of the seventh embodiment.

The element mounting portion 10c can be configured from resin, a fiber laminated plate impregnated with resin, ceramic, glass, silicon, and the like. As the fiber laminated plate, for example, a glass fiber laminated plate is considered. Since resin forming the element mounting portion 10c absorbs light using a surface of the element mounting portion 10c and have low reflection, the resin may contain carbon, silica, and the like. For the same purpose, resin with which the fiber laminated plate is impregnated may contain carbon, silica, and the like. A metal wiring can be disposed on the surface of the element mounting portion 10c even if not particularly shown. In this case, low reflectance plating may be applied to a surface of the metal wiring. In this manner, the surface of the element mounting portion 10c has low reflectivity and light absorbability, such that it is possible to suppress light reflection in the resin sealing portions 3a and 3b.

The element mounting portion 10c may be formed from a metal in the same manner as the leads 10a and 10b. As the metal, copper, iron, aluminum, and the like are used. Surfaces of the leads 10a and 10b and the surface of the element mounting portion 10c may be metalized by low reflectance plating and the like.

(Sealing Resin)

Most of conventional semiconductor packages are packages in which an entire periphery of a semiconductor element is molded by resin. For example, with a package structure in which a large number of semiconductor elements are mounted on a lead frame of a large area available for receiving multi-pieces and the periphery of each semiconductor element is sealed by resin, excellent productivity, cost reduction, and a decrease in size and thickness are realized.

In many semiconductor elements such as IC and LSI, a sealing resin is colored in black and is non-transmissive.

Even in optical semiconductor elements such as light-emitting elements, light-receiving elements, and optical sensor elements, it is possible to realize excellent productivity, cost reduction, and a decrease in size and thickness by using a resin having translucency with respect to light such as infrared light and visible light as a sealing resin, like the non-transmissive sealing resin.

Among conventional sealing resins, an epoxy resin is excellent in handleability, performance, cost, and the like, and has been used for many years. If a transparent resin such as an epoxy resin is used for sealing a light-receiving element, light incident from the outside can receive not only light incident in a direction just above but also light incident in an oblique direction, and a light-receiving range can be broadened.

However, most of resins having translucency in the visible light wavelength band absorb light in the ultraviolet light wavelength band and do not transmit the light. Then, for example, it is possible to realize a resin transmitting a short wavelength band of about 300 nm or less by adopting a polymer structure suppressing absorbance of ultraviolet light, reducing an impurity which can absorb ultraviolet light, and the like. Accordingly, it is possible to realize an optical sensor device for detecting ultraviolet light which can be manufactured with high productivity and at a low cost, and can be decreased in size and thickness as compared to, for example, a package using an inorganic brittle material such as sapphire or quartz as a window member, which has been described in Japanese Unexamined Patent Application, First Publication No. 2009-200222.

Figure 14A:
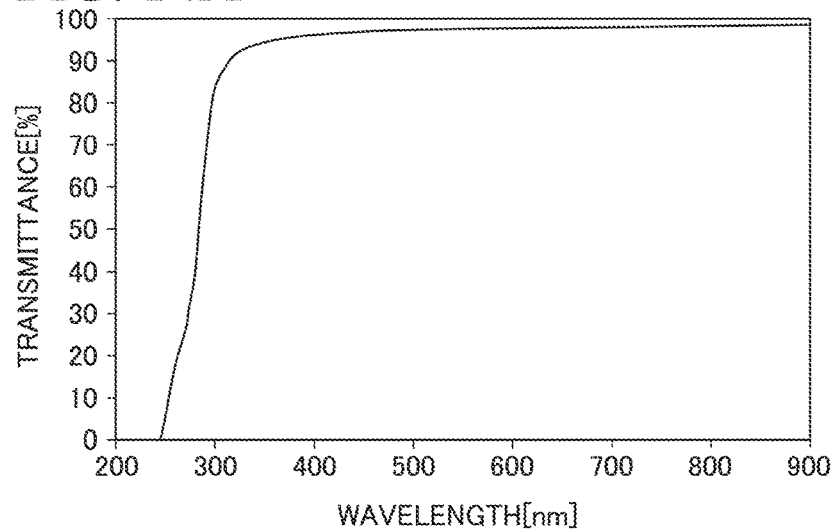
FIG. 14A is a graph which shows transmission spectral characteristics of a sealing resin.
Figure 14B:
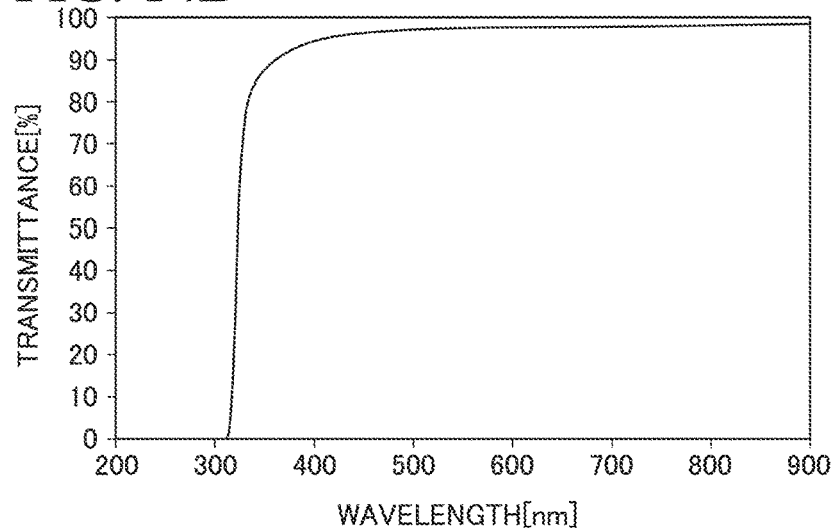
FIG. 14B is a graph which shows the transmission spectral characteristics of a sealing resin.
Figure 14C:
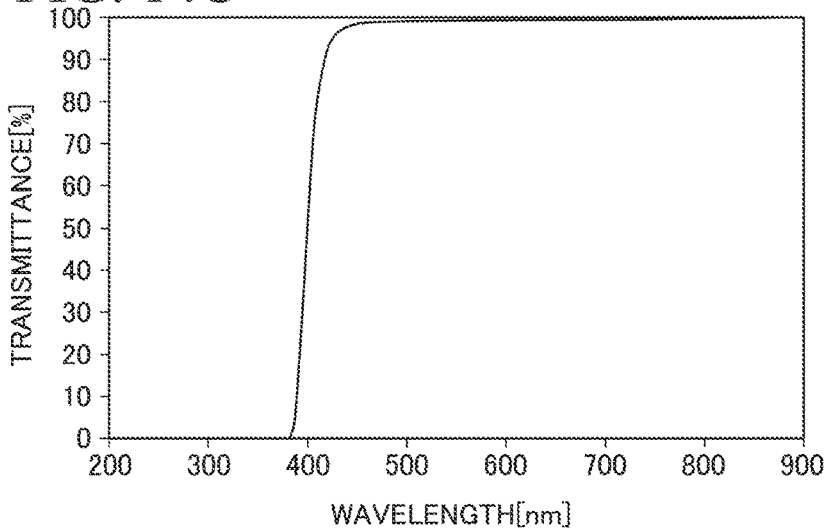
FIG. 14C is a graph which shows the transmission spectral characteristics of a sealing resin.

A transparent resin used in the sealing resins 4a and 4b may be two types of resins selected among, for example, a first transparent resin which shows permeability from a wavelength band of about 250 nm as shown in FIG. 14A, a second transparent resin which shows permeability from a wavelength band of about 315 nm as shown in FIG. 14B, and a third transparent resin which shows permeability from a wavelength band of about 380 nm as shown in FIG. 14C.

According to the first to the sixth embodiments, when the second sealing resin 4b is laminated onto some region of the first sealing resin 4a, a lower limit value of the transmission wavelength band of the second sealing resin 4b is selected so as to be longer than a lower limit value of the transmission wavelength band of the first sealing resin 4a.

According to the seventh embodiment and the eighth embodiment, when the first sealing resin 4a seals only the first light receiving portion 2a, and the second sealing resin 4b seals only the second light receiving portion 2b, it is only necessary that there is a difference between the lower limit value of the transmission wavelength bands of respective sealing resins 4a and 4b. That is, the lower limit value of the transmission wavelength band of the second sealing resin 4b may be longer or shorter than the lower limit value of the transmission wavelength band of the first sealing resin 4a.

The first transparent resin has a transmittance of 80% or more at a wavelength of about 280 nm, and may have a transmittance of about 80% to 90% or more at wavelengths of 280 nm to 300 nm. A lower limit value of a transmission wavelength band of the first transparent resin is, for example, about 240 nm to 280 nm. The first transparent resin may have a transmittance of 90% or more or 95% or more at a wavelength band longer than 300 nm.

Transmission spectral characteristics of the first transparent resin may have a rising portion within a range from about 250 nm to about 300 nm, and may have a region showing a peak transmittance in which a transmittance does not substantially change on a wavelength side longer than the rising portion. As the first transparent resin, a first epoxy resin formed from triglycidyl isocyanurate is considered.

The second transparent resin has a transmittance of 80% or more at a wavelength of about 320 nm, and may have a transmittance of about 80% to 90% or more at wavelengths of 320 nm to 350 nm. A lower limit value of a transmission wavelength band of the second transparent resin is, for example, about 310 nm to 320 nm. The second transparent resin may have a transmittance of 90% or more or 95% or more at a wavelength band longer than 350 nm.

Transmission spectral characteristics of the second transparent resin may have a rising portion within a range from about 310 nm to about 350 nm, and may have a region showing a peak transmittance in which a transmittance does not substantially change on a wavelength side longer than the rising portion. As the second transparent resin, a second epoxy resin formed from a mixture of triglycidyl isocyanurate and bisphenol A diglycidyl ether and having triglycidyl isocyanurate as a main component is considered.

The third transparent resin has a transmittance of 80% or more at a wavelength of about 390 nm, and may have a transmittance of about 80% to 90% or more at wavelengths of 390 nm to 400 nm. A lower limit value of a transmission wavelength band of the third transparent resin is, for example, about 380 nm to 390 nm. The third transparent resin may have a transmittance of 90% or more or 95% or more at a wavelength band longer than 400 nm.

Transmission spectral characteristics of the third transparent resin may have a rising portion within a range from about 380 nm to about 400 nm, and may have a region showing a peak transmittance in which a transmittance does not substantially change on a wavelength side longer than the rising portion. As the third transparent resin, a third epoxy resin formed from a mixture of bisphenol A diglycidyl ether and triglycidyl isocyanurate and having bisphenol A diglycidyl ether as a main component is considered.

As a resin having the transmission spectral characteristics described above, a resin having a skeleton not containing a conjugated double bond or a resin mixture containing the resin having a skeleton not containing a conjugated double bond is considered. The conjugated double bond is included in, for example, a benzene ring, other aromatic rings, or the like. As the resin having a skeleton not containing a conjugated double bond, a saturated aliphatic epoxy resin such as triglycidyl isocyanurate is considered. Examples of saturated aliphatic series include acyclic, alicyclic, heterocyclic, and the like. An epoxy resin with a structure of having triglycidyl isocyanurate in a resin skeleton does not have a conjugated double bond, and thus has the transmission characteristics for the ultraviolet light wavelength band. Transmission spectral characteristics shown in FIG. 14A are representative characteristics thereof.

When the resin having a skeleton not containing a conjugated double bond and a resin having a skeleton containing a conjugated double bond are mixed, absorbance characteristics is realized in the ultraviolet light wavelength band. As the resin having a skeleton containing a conjugated double bond, an aromatic epoxy resin such as bisphenol A diglycidyl ether is considered.

When the resin having a skeleton not containing a conjugated double bond is a main component and a containment rate of the resin having a skeleton containing a conjugated double bond is smaller than a containment rate of the main component, the resin has transmission characteristics for a portion of the ultraviolet light wavelength band, but a lower limit value of the transmission wavelength band changes towards a long wavelength side. Transmission spectral characteristics shown in FIG. 14B are representative characteristics thereof.

When the resin having a skeleton containing a conjugated double bond is a main component and a containment rate of the resin having a skeleton not containing a conjugated double bond is smaller than a containment rate of the main component, the lower limit value of the transmission wavelength band falls into the visible light wavelength band or in the vicinity of a boundary between visible light and ultraviolet light. Transmission spectral characteristics shown in FIG. 14C are representative characteristics thereof.

In the present specification, "main component" means that an amount of the component is larger than an amount of other components. For example, a component having a mass ratio of 50% or more may also be defined as a main component. Even when a total amount of two or more types of components having common characteristics is larger than the amount of other components, a total of two or more types of components having common characteristics can be set as "main component".

The transmission spectral characteristics shown in FIGS. 14A to 14C show that the lower limit values of the transmission wavelength band corresponding to the first transparent resin, the second transparent resin, and the third transparent resin are about 240 nm to 250 nm, about 315 nm to 320 nm, and about 375 nm to 380 nm, respectively. Moreover, the transmission spectral characteristics shown in FIGS. 14A to 14C have a rising portion which shows a high transmittance on a wavelength side about 10 nm to 30 nm longer than the lower limit values of the transmission wavelength band, and reaches the peak transmittance with a steep inclination.

By selecting and combining two types from the first to the third transparent resins, it is possible to selectively obtain an amount of ultraviolet light irradiation in a wavelength band corresponding to a difference in the rising portion in the transmission spectral characteristics of two types of resins.

Figure 15A:
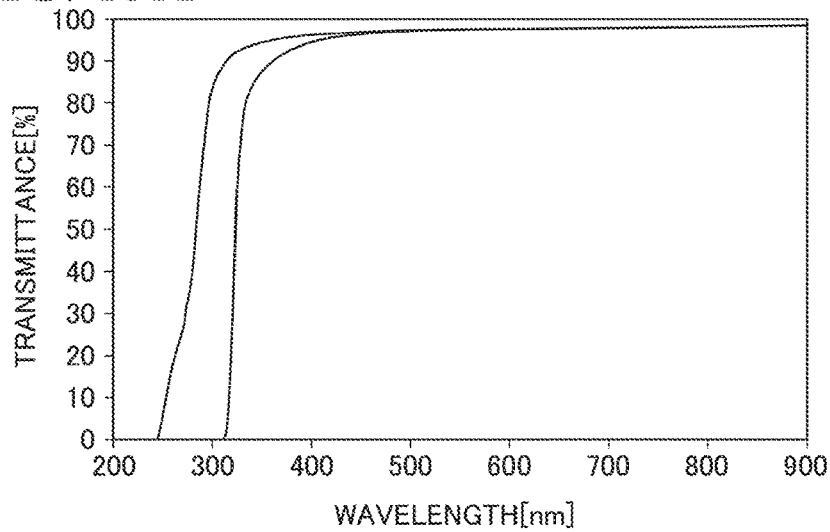
FIG. 15A is a graph which shows transmission spectral characteristics of two types of sealing resins.

For example, transmission spectral characteristics due to a combination of the first transparent resin and the second transparent resin are shown in FIG. 15A. According to an optical sensor device which combines the first transparent resin and the second transparent resin and uses the result in a resin sealing portion, it is possible to selectively obtain an amount of ultraviolet light irradiation in a wavelength band from about 250 nm to about 320 nm.

Figure 15B:
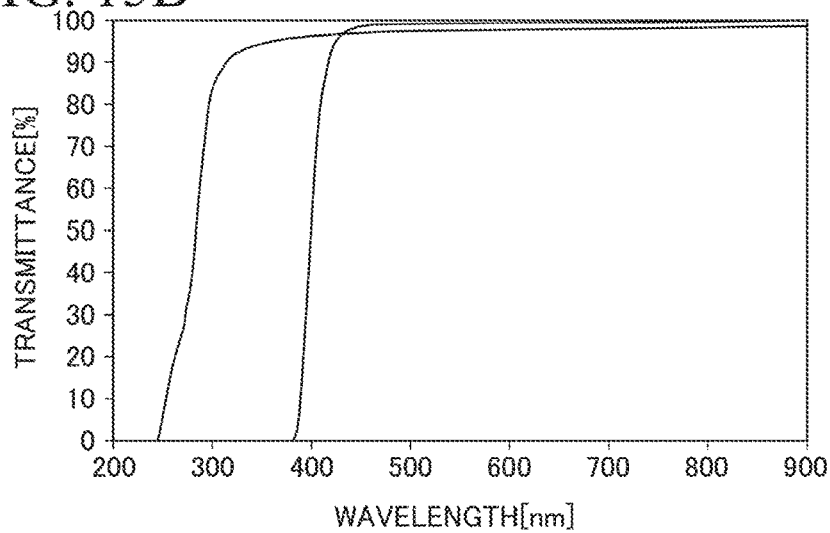
FIG. 15B is a graph which shows the transmission spectral characteristics of two types of sealing resins.

Transmission spectral characteristics due to a combination of the first transparent resin and the third transparent resin are shown in FIG. 15B. According to an optical sensor device which combines the first transparent resin and the third transparent resin and uses the result in the resin sealing portion, it is possible to selectively obtain an amount of ultraviolet light irradiation in a wavelength band from about 250 nm to about 380 nm.

Figure 15C:
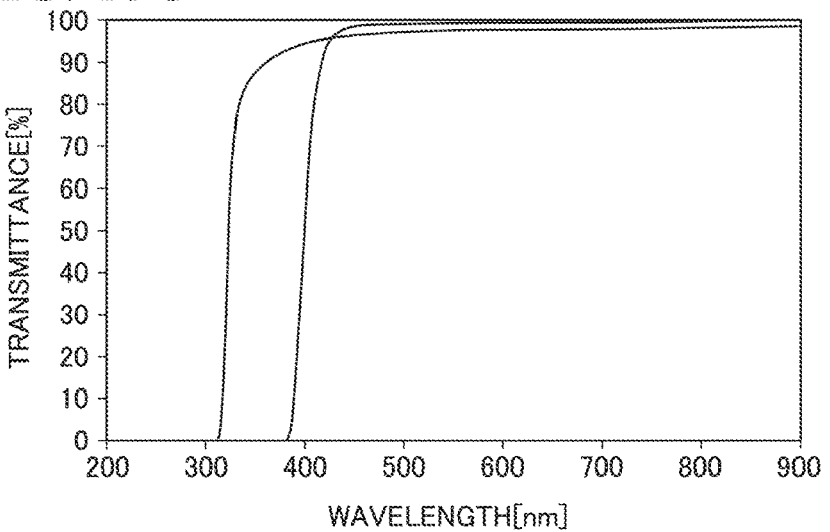
FIG. 15C is a graph which shows the transmission spectral characteristics of two types of sealing resins.

Transmission spectral characteristics due to a combination of the second transparent resin and the third transparent resin are shown in FIG. 15C. According to the optical sensor device which combines the second transparent resin and the third transparent resin and uses the result in a resin sealing portion, it is possible to selectively obtain an amount of ultraviolet light irradiation in a wavelength band from about 320 nm to about 380 nm.

As a transparent resin used in a resin sealing portion, a resin with a small containment amount of ionic impurity such as sodium ion and chlorine ion is preferred to suppress light absorbance in the ultraviolet light wavelength band. A decrease in the containment amount of impurity is effective for improving the transmittance in the ultraviolet light wavelength band.

As described above, the optical sensor device according to the embodiments described above can include a resin sealing portion having characteristics of transmitting ultraviolet light, be manufactured at a low cost, and have a resin package structure enabling a decrease in size and thickness.

(Signal Processing Circuit)

The optical sensor device of the embodiments described above may include a signal processing circuit with functions of identifying a difference in outputs output from each light receiving portion and of obtaining an intensity of ultraviolet incident light to the optical sensor device. The signal processing circuit may include a device which amplifies an output which is output from each light receiving portion. The signal processing circuit may be disposed inside a resin package structure including a light receiving portion. The signal processing circuit may be disposed outside the resin package structure. A resin package structure including a light receiving portion and a circuit component including a signal processing circuit are separately supplied and may be configured to be appropriately combined to be used.

As the signal processing circuit, for example, a circuit shown in FIG. 3 of Japanese Unexamined Patent Application, First Publication No. 2009-177150 is considered.

The light receiving portions 2a and 2b of the embodiments described above are, for example, light receiving portions of a photodiode. A first photodiode is configured by the sealing portion 3a and the light receiving portion 2a of the embodiments described above, and a second photodiode is configured by the sealing portion 3b and the light receiving portion 2b.

Since each of the sealing portions 3a and 3b has different transmission spectral characteristics, spectral characteristics of the first photodiode and spectral characteristics of the second photodiode are different from each other. An anode terminal of each photodiode is grounded and an output of a cathode terminal is connected to an amplifier. Each cathode terminal is connected to a direct current power supply via each switch.

Each switch is configured by switching elements such as a transistor and the like, and turns on or off a connection between a photodiode and a direct current power supply according to a reset signal from a reset circuit. A cathode terminal of the first photodiode is connected to the direct current power supply via a first switch, and a cathode terminal of the second photodiode is connected to the direct current power supply via a second switch. The direct current power supply is configured by, for example, a constant voltage circuit, and if each switch is turned on, the cathode terminal of each photodiode is set to a reference voltage.

The amplifier is configured by an amplifier circuit such as an operational amplifier or the like, detects and amplifies a voltage at the cathode terminal of each photodiode, and outputs the voltage to a difference circuit. The cathode terminal of the first photodiode is connected to the difference circuit via a first amplifier and the cathode terminal of the second photodiode is connected to the difference circuit via a second amplifier.

The difference circuit receives voltages output from two amplifiers, generates a difference between the voltages, and outputs the difference to a determination unit. The determination unit samples and acquires a difference in voltage output from the difference circuit in synchronization with a reset signal from the reset circuit, and determines a light amount of ultraviolet light according to the difference. Sampling can be performed, for example, immediately before resetting.

The circuits described above operate as follows.

If the reset circuit is switched on, a cathode terminal of each photodiode becomes a reference voltage by the direct current power supply and electric charges accumulated in each photodiode are set to initial values. Next, if the reset circuit is switched off, since each photodiode is disconnected from the direct current power supply and an input impedance of the amplifier is infinite, and becomes an open end state in which the cathode terminal is electrically disconnected from the circuit. As a result, a photodiode accumulates electric charges generated by light. Then, since the photodiode is biased in a reverse direction by the direct current power supply, the voltage of the cathode terminal drops at a speed corresponding to an intensity of light according to electric charges accumulated in the photodiode.

If the reset circuit is repeatedly switched on or off, a voltage at the cathode terminal of each photodiode repeats states of "reset to a reference voltage"→"voltage drop due to charge accumulation"→"reset to a reference voltage," and the like.

Since spectral characteristics of two photodiodes are different, there is a difference in the speed at which a voltage drops. For this reason, an output of each photodiode is amplified by each amplifier, and then if a difference in the output is taken by a difference circuit, this difference is a difference in electric charge accumulated in the photodiode, that is, a value in accordance with a light amount of ultraviolet light. Then, a determination unit detects an output of the difference circuit a predetermined time after a reset. A detection timing may be, for example, immediately before a next reset. A difference in electric charge accumulated in each photodiode from a reset to detection can be detected as a voltage difference by detecting an output of the difference circuit, such that it is possible to determine a light amount of ultraviolet light.

The optical sensor device according to each embodiment of the present invention can be used in portable toys, healthcare products, wearable terminals, portable terminals, home appliances, and the like. This can be also applied to automotive applications, and outdoor applications with severe usage environments.

Each embodiment of the present invention and a modification thereof haven been described above, these embodiments and modifications thereof are presented as examples, and are not intended to limit the scope of the invention. These embodiments and the modifications can be implemented in various other modes, and various omissions, substitutions, and changes can be made within a range not departing from the gist of the invention. These embodiments and the modifications are included in the invention described in the scope of claims and the equivalent scope as well as in the scope and the gist of the invention. Each embodiment and a modification thereof described above can be appropriately combined with each other.

What is claimed is:

1. An optical sensor device comprising:
   a first light receiving portion having sensitivity to ultraviolet light;
   a first sealing portion covering the first light receiving portion;
   a second light receiving portion having sensitivity to ultraviolet light; and
   a second sealing portion covering the second light receiving portion,
   at least one of the first sealing portion and the second sealing portion being configured to transmit at least part of an ultraviolet light wavelength band,
   the first sealing portion being formed from one resin layer or more than one resin layers, and the first sealing portion having a transmission spectral characteristic in which a first wavelength is set as a lower limit value of a transmission wavelength band, and
   the second sealing portion being formed from one resin layer or more than one resin layers, and the second sealing portion having a transmission spectral characteristic in which a second wavelength different from the first wavelength is set as a lower limit value of a transmission wavelength band.

2. The optical sensor device according to claim 1, wherein both the first sealing portion and the second sealing portion are integratedly included in a resin sealing portion, and the resin sealing portion is formed from a plurality of transparent resins adjacent to each other.

3. The optical sensor device according to claim 1, wherein the first sealing portion and the second sealing portion are formed using two types of resins selected from:
   a first transparent resin which shows permeability from 250 nm and has a transmission spectral characteristic in which a transmittance in a wavelength band longer than 300 nm is equal to or more than 90%,
   a second transparent resin which shows permeability from 315 nm and has a transmission spectral characteristic in which a transmittance in a wavelength band longer than 350 nm is equal to or more than 90%, and
   a third transparent resin which shows permeability from 380 nm and has a transmission spectral characteristic in which a transmittance in a wavelength band longer than 400 nm is equal to or more than 90%.

4. The optical sensor device according to claim 2, wherein the first sealing portion and the second sealing portion are formed using two types of resins selected from:
   a first transparent resin which shows permeability from 250 nm and has a transmission spectral characteristic in which a transmittance in a wavelength band longer than 300 nm is equal to or more than 90%,
   a second transparent resin which shows permeability from 315 nm and has a transmission spectral characteristic in which a transmittance in a wavelength band longer than 350 nm is equal to or more than 90%, and
   a third transparent resin which shows permeability from 380 nm and has a transmission spectral characteristic in which a transmittance in a wavelength band longer than 400 nm is equal to or more than 90%.

5. The optical sensor device according to claim 1, wherein the first sealing portion and the second sealing portion are formed using two types of resins selected from:
   a first epoxy resin which shows permeability from 250 nm, the first epoxy resin having a transmission spectral characteristic in which a transmittance in a wavelength band longer than 300 nm is equal to or more than 90%, and the first epoxy resin being made from triglycidyl isocyanurate;
   a second epoxy resin which shows permeability from 315 nm, the second epoxy resin having a transmission spectral characteristic in which a transmittance in a wavelength band longer than 350 nm is equal to or more than 90%, and the second epoxy resin being made from a mixture of triglycidyl isocyanurate and bisphenol A diglycidyl ether with the triglycidyl isocyanurate as a main component, and
   a third epoxy resin which shows permeability from 380 nm, the third epoxy resin having a transmission spectral characteristic in which a transmittance in a wavelength band longer than 400 nm is equal to or more than 90%, and the third epoxy resin being formed from a mixture of bisphenol A diglycidyl ether and triglycidyl isocyanurate with the bisphenol A diglycidyl ether as a main component.

6. The optical sensor device according to claim 2, wherein the first sealing portion and the second sealing portion are formed using two types of resins selected from:
   a first epoxy resin which shows permeability from 250 nm, the first epoxy resin having a transmission spectral characteristic in which a transmittance in a wavelength band longer than 300 nm is equal to or more than 90%, and the first epoxy resin being made from triglycidyl isocyanurate;
   a second epoxy resin which shows permeability from 315 nm, the second epoxy resin having a transmission spectral characteristic in which a transmittance in a wavelength band longer than 350 nm is equal to or more than 90%, and the second epoxy resin being made from a mixture of triglycidyl isocyanurate and bisphenol A diglycidyl ether with the triglycidyl isocyanurate as a main component, and
   a third epoxy resin which shows permeability from 380 nm, the third epoxy resin having a transmission spectral characteristic in which a transmittance in a wavelength band longer than 400 nm is equal to or more than 90%, and the third epoxy resin being formed from a mixture of bisphenol A diglycidyl ether and triglycidyl isocyanurate with the bisphenol A diglycidyl ether as a main component.

7. The optical sensor device according to claim 1, wherein the first sealing portion and the second sealing portion are formed using two types of resins selected from:
   a first transparent resin which shows permeability from 250 nm, the first transparent resin having a transmission spectral characteristic with a rising portion having a transmittance equal to or more than 80% at 280 nm and a transmittance equal to or more than 90% at 300 nm, and with a transmittance equal to or more than 95% on a wavelength side longer than the rising portion,
   a second transparent resin which shows permeability from 315 nm, the second transparent resin having a transmission spectral characteristic with a rising portion having a transmittance equal to or more than 80% at 320 nm and a transmittance equal to or more than 90% at 350 nm, and with a transmittance equal to or more than 95% on a wavelength side longer than the rising portion, and a third transparent resin which shows permeability from 380 nm, the third transparent resin having a transmission spectral characteristic with a rising portion having a transmittance equal to or more than 80% at 390 nm and a transmittance equal to or more than 90% at 400 nm, and with a transmittance equal to or more than 95% on a wavelength side longer than the rising portion.

8. The optical sensor device according to claim 2, wherein the first sealing portion and the second sealing portion are formed using two types of resins selected from:

a first transparent resin which shows permeability from 250 nm, the first transparent resin having a transmission spectral characteristic with a rising portion having a transmittance equal to or more than 80% at 280 nm and a transmittance equal to or more than 90% at 300 nm, and with a transmittance equal to or more than 95% on a wavelength side longer than the rising portion, a second transparent resin which shows permeability from 315 nm, the second transparent resin having a transmission spectral characteristic with a rising portion having a transmittance equal to or more than 80% at 320 nm and a transmittance equal to or more than 90% at 350 nm, and with a transmittance equal to or more than 95% on a wavelength side longer than the rising portion, and a third transparent resin which shows permeability from 380 nm, the third transparent resin having a transmission spectral characteristic with a rising portion having a transmittance equal to or more than 80% at 390 nm and a transmittance equal to or more than 90% at 400 nm, and with a transmittance equal to or more than 95% on a wavelength side longer than the rising portion.

9. The optical sensor device according to claim 1, further comprising:

at least one package structure which includes an element mounting portion, a sensor chip mounted on the element mounting portion, and a resin sealing portion which seals the sensor chip and the element mounting portion, wherein the first light receiving portion and the second light receiving portion are included in the sensor chip, and the first sealing portion and the second sealing portion are included in the resin sealing portion.

10. The optical sensor device according to claim 9, wherein the element mounting portion is formed from a resin containing carbon or silica.

11. The optical sensor device according to claim 9, wherein the element mounting portion is configured by a fiber laminated plate impregnated with a resin containing carbon or silica.

12. The optical sensor device according to claim 9, wherein the element mounting portion is formed from a ceramic.

13. The optical sensor device according to claim 9, wherein low reflectance plating is applied to a surface of a metal wiring disposed on a surface of the element mounting portion.

14. The optical sensor device according to claim 9, wherein the optical sensor device includes a lead adjacent to the element mounting portion, wherein one end of the lead is connected to the sensor chip by a wire, wherein the other end of the lead is exposed to the outside of the resin sealing portion as an external terminal, and wherein low reflectance plating is applied to a surface of the lead.

15. The optical sensor device according to claim 1, further comprising:

a package structure which includes a first sensor chip including the first light receiving portion, a second sensor chip including the second light receiving portion, an element mounting portion on which the first sensor chip and the second sensor chip are mounted, and a resin sealing portion which seals the first sensor chip, the second sensor chip, and the element mounting portion, wherein the resin sealing portion includes a first sealing resin which covers the first light receiving portion thicker than the second light receiving portion, the first sealing resin sealing at least a periphery of the first sensor chip and the second sensor chip, and a second sealing resin which is disposed by overlapping the first sealing resin above the second light receiving portion, and wherein a lower limit value of a transmission wavelength band of the second sealing resin is longer than a lower limit value of a transmission wavelength band of the first sealing resin.

16. The optical sensor device according to claim 1, further comprising:

a package structure which includes a sensor chip including the first light receiving portion and the second light receiving portion, an element mounting portion on which the sensor chip is mounted, and a resin sealing portion which seals the sensor chip and the element mounting portion, wherein the resin sealing portion includes a first sealing resin which covers the first light receiving portion thicker than the second light receiving portion, the first sealing resin sealing at least a periphery of the sensor chip, and a second sealing resin which is disposed by overlapping the first sealing resin above the second light receiving portion, and wherein a lower limit value of a transmission wavelength band of the second sealing resin is longer than a lower limit value of a transmission wavelength band of the first sealing resin.

17. The optical sensor device according to claim 15, wherein the resin sealing portion has a structure in which an interface between the first sealing resin and the second sealing resin is angled and a thickness of the second sealing resin increases.

18. The optical sensor device according to claim 1, wherein the first light receiving portion and the second light receiving portion have the same light receiving characteristics for ultraviolet light and visible light.

19. The optical sensor device according to claim 1, wherein the optical sensor device has functions of identifying a difference between a first output which is output from the first light receiving portion and a second output which is output from the second light receiving portion for obtaining intensity of ultraviolet incident light to the optical sensor device.

* * * * *